United States Patent
Li

(10) Patent No.: US 12,349,387 B2
(45) Date of Patent: Jul. 1, 2025

(54) SEMICONDUCTOR DEVICE THAT COMPRISES AN HEMT AND AN HHMT WITH A BACKSIDE CONTACT ELECTRODE AND THE MANUFACTURING METHOD THEREOF

(71) Applicant: GUANGDONG ZHINENG TECHNOLOGY CO., LTD., Guangdong (CN)

(72) Inventor: Zilan Li, Guangzhou (CN)

(73) Assignee: GUANGDONG ZHINENG TECHNOLOGY CO., LTD., Guangdong (CN)

( * ) Notice: Subject to any disclaimer, the term of this patent is extended or adjusted under 35 U.S.C. 154(b) by 60 days.

(21) Appl. No.: 17/436,058

(22) PCT Filed: Mar. 3, 2021

(86) PCT No.: PCT/CN2021/078959
§ 371 (c)(1),
(2) Date: Sep. 2, 2021

(87) PCT Pub. No.: WO2021/258771
PCT Pub. Date: Dec. 30, 2021

(65) Prior Publication Data
US 2023/0103393 A1     Apr. 6, 2023

(30) Foreign Application Priority Data

Jun. 23, 2020   (CN) .......................... 202010593852.1

(51) Int. Cl.
*H10D 30/47*      (2025.01)
*H01L 21/02*      (2006.01)
(Continued)

(52) U.S. Cl.
CPC ..... *H10D 30/475* (2025.01); *H01L 21/02381* (2013.01); *H01L 21/0243* (2013.01);
(Continued)

(58) Field of Classification Search
CPC ............. H01L 29/7786; H01L 21/0243; H01L 21/02645; H01L 29/205; H01L 29/66462;
(Continued)

(56) References Cited

U.S. PATENT DOCUMENTS

| | | | | |
|---|---|---|---|---|
| 6,635,925 | B1* | 10/2003 | Taniguchi | H10D 30/0221 257/E29.268 |
| 2008/0157090 | A1* | 7/2008 | Thomson | H01L 21/02543 257/66 |

(Continued)

FOREIGN PATENT DOCUMENTS

| | | |
|---|---|---|
| CN | 105448977 A1 | 3/2016 |
| CN | 105762078 A1 | 11/2018 |

(Continued)

OTHER PUBLICATIONS

International Search Report and Written Opinion for PCT/CN2021/078959 issued May 21, 2021, 9 total pages.
(Continued)

*Primary Examiner* — William B Partridge
*Assistant Examiner* — David Paul Sedorook
(74) *Attorney, Agent, or Firm* — Tyler Sisk; Casimir Jones SC

(57) ABSTRACT

The present disclosure provides a semiconductor device and a manufacturing method thereof. The semiconductor device includes a substrate, a groove formed on the substrate, a channel layer structure grown under restriction of the groove structure, the channel layer structure being exposed from an upper surface of the substrate; a barrier layer covering the exposed channel layer structure, a two-dimensional electron (Continued)

* background positive charge
· background negative charge gas and a two-dimensional hole gas respectively formed on a second face and a first face of the channel layer structure, and a source, a gate, and a drain formed on the first face/second face of the channel layer structure, and a bottom electrode formed on the second face/first face of the channel layer structure.

14 Claims, 17 Drawing Sheets

(51) Int. Cl.
  *H10D 30/01* (2025.01)
  *H10D 62/824* (2025.01)
  *H10D 62/85* (2025.01)
(52) U.S. Cl.
  CPC .... *H01L 21/02458* (2013.01); *H01L 21/0254* (2013.01); *H01L 21/02645* (2013.01); *H10D 30/015* (2025.01); *H10D 62/824* (2025.01); *H10D 62/8503* (2025.01)
(58) Field of Classification Search
  CPC ........... H01L 21/02458; H01L 21/0254; H01L 29/2003; H01L 21/02381; H10D 30/475; H10D 30/015; H10D 62/824; H10D 62/8503; H10D 30/478; H10D 62/221; H10D 64/27; H10D 62/107; H10D 62/149; H10D 62/10; H10D 62/124; H10D 30/4732
  See application file for complete search history.

(56) References Cited

U.S. PATENT DOCUMENTS

| | | | | |
|---|---|---|---|---|
| 2009/0189192 | A1* | 7/2009 | Lieten | H01L 21/02381 257/E29.081 |
| 2011/0108850 | A1* | 5/2011 | Cheng | H01L 21/8252 257/E27.059 |
| 2013/0168735 | A1* | 7/2013 | Fukuhara | H01L 29/1029 257/190 |
| 2014/0077311 | A1* | 3/2014 | Simin | H01L 29/861 257/487 |
| 2014/0091364 | A1 | 4/2014 | Imanishi et al. | |
| 2014/0141592 | A1* | 5/2014 | Irsigler | H01L 21/76224 438/424 |
| 2014/0170998 | A1 | 6/2014 | Then et al. | |
| 2014/0225122 | A1 | 8/2014 | Takeya et al. | |
| 2018/0219086 | A1 | 8/2018 | Higuchi et al. | |
| 2019/0081164 | A1 | 3/2019 | Shrivastava | |
| 2019/0237324 | A1* | 8/2019 | Araki | C30B 29/403 |
| 2020/0328297 | A1 | 10/2020 | Li | |
| 2021/0082911 | A1* | 3/2021 | Chiu | H01L 27/0694 |

FOREIGN PATENT DOCUMENTS

| | | |
|---|---|---|
| CN | 110224019 A1 | 9/2019 |
| CN | 111816700 A1 | 10/2020 |
| CN | 111816702 A1 | 10/2020 |
| CN | 111816706 A1 | 10/2020 |
| JP | 2014072397 A | 4/2014 |
| JP | 2017022323 A | 1/2017 |
| WO | 2009001888 A1 | 12/2008 |

OTHER PUBLICATIONS

Japan Patent Office, Decision to Grant a Patent for JP Application No. 2022-552997, mailed Jun. 17, 2024.
Japan Patent Office, Notice of Reasons for Refusal for JP Application No. 2022-552997, mailed Jun. 7, 2023.
Japan Patent Office, Notice of Reasons for Refusal for JP Application No. 2022-552997, mailed Dec. 5, 2023.
European Patent Office, Search report for EP Application No. 21758580.1 mailed May 12, 2022.
European Patent Office, Communication Pursuant to Article 94(3) EPC for EP Application No. 21758580.1 mailed May 24, 2022.
Korean Patent Office, First Office Action (Request for the Submission of an Opinion) for KR Application No. 10-2022-7019319 mailed Jun. 25, 2024.
China Patent Office, First Office Action for CN Application No. 202010593852.1, mailed Jul. 4, 2024.

\* cited by examiner

— · — · — 2DEG
· · · · · · · · · · 2DHG
+ background positive charge
− background negative charge

SEMICONDUCTOR DEVICE THAT COMPRISES AN HEMT AND AN HHMT WITH A BACKSIDE CONTACT ELECTRODE AND THE MANUFACTURING METHOD THEREOF

CROSS-REFERENCE TO RELATED APPLICATION

This application is a 35 U.S.C § 371 national stage application of International Application No. PCT/CN2021/078959, filed on Mar. 3, 2021, entitled "SEMICONDUCTOR DEVICE AND MANUFACTURING METHOD THEREOF," which application claims the benefit of priority to Chinese Patent Application No. 202010593852.1 filed Jun. 23, 2020, the disclosures and contents of all of which are hereby incorporated by reference in their entireties.

TECHNICAL FIELD

The present disclosure relates to the field of semiconductors, more particularly, to a semiconductor device capable of adjusting electric field distribution and a manufacturing method thereof.

BACKGROUND ART

Group III nitride semiconductor is an important new semiconductor material, mainly including AlN, GaN, InN and compounds of these materials such as AlGaN, InGaN, and AlInGaN. By utilizing the advantages of direct band gap, wide forbidden band, high breakdown electric field intensity and so on of the group III nitride semiconductor, the group III nitride semiconductor has great prospect in the field of power devices and radio frequency devices through the optimized design of device structures and processes. The transistor with high electron mobility and high hole mobility is an important device to which a group III nitride semiconductor is applied, and it is desired to realize a transistor, with high electron mobility and high hole mobility, having high performances such as high withstand voltage, high power, low on-resistance, and high reliability.

In order to improve the withstand voltage of the device by utilizing the high critical breakdown electric field characteristics of the group III nitride semiconductor material, many studies have been made, for example, increasing the thickness or quality of a channel layer in a longitudinal direction, and increasing the length of a drift region in a lateral direction, but the above improvements will result in an increased device area, a high cost, even increased on-resistance of the device, increased power consumption, and consequently a reduced switching speed, or the adopted solutions have limited withstand voltage effects.

SUMMARY

In view of this, the present disclosure provides a semiconductor device structure and a manufacturing method thereof.

In the following, a brief summary of the present disclosure will be given in order to provide a basic understanding of certain aspects of the present disclosure. It should be understood that this summary is not an exhaustive summary of the present disclosure. It is not intended to determine the key or important part of the present disclosure, nor is it intended to limit the scope of the present disclosure. Its purpose is merely to present some concepts in a simplified form as a prelude to the more detailed description that will be discussed later.

According to one aspect of the present disclosure, a method for manufacturing a semiconductor device is provided, including:

providing a substrate; forming a groove on the substrate, wherein a side surface of the groove has a hexagonal symmetrical lattice structure;

forming a single crystal seed layer on the side surface of the groove;

growing a channel layer along the groove by taking the single crystal seed layer as a core under restriction of the groove;

etching the substrate, to enable the channel layer to protrude from an upper surface of the etched substrate;

forming a barrier layer on the exposed channel layer, then forming a two-dimensional electron gas and immovable background positive charges on a first face of the channel layer, and/or forming a two-dimensional hole gas and immovable background negative charges on a second face of the channel layer; and forming a source, a gate, and a drain on the first face/the second face of the channel layer, and forming a bottom electrode on the second face/the first face of the channel layer.

Optionally, step 400 is replaced by step 401, and the step 401 includes growing a first channel layer, a first adjusting layer, and a second channel layer, along the groove, by taking the single crystal seed layer as a core under restriction of the groove.

Optionally, step 400 is replaced by step 402, and the step 402 includes growing a first channel layer, a second adjusting layer, and a second channel layer, along the groove, by taking the single crystal seed layer as a core under restriction of the groove.

Optionally, step 400 is replaced by step 403, and the step 403 includes growing a first channel layer, a first adjusting layer, a second adjusting layer, and a second channel layer, along the groove, by taking the single crystal seed layer as a core under restriction of the groove.

Optionally, the bottom electrode is at least connected to one of the first adjusting layer, the second adjusting layer, the two-dimensional electron gas, and the two-dimensional hole gas.

Optionally, the bottom electrode is formed on the second face of the channel layer, and the first/second adjusting layer has P-type doping; alternatively, the bottom electrode is formed on the first face of the channel layer, and the first/second adjusting layer has N-type doping.

Optionally, a doping concentration in the first adjusting layer is less than $5E18/cm^3$; and a doping concentration in the second adjusting layer is $1E17$-$5E19/cm^3$.

Optionally, the source, the gate, and the drain are provided to be coplanar or non-coplanar.

Optionally, the source and the drain are directly or indirectly formed on the channel layer, and the gate is directly or indirectly formed on the barrier layer.

Optionally, before growing the channel layer, a buffer layer is deposited on the seed layer.

Optionally, the seed layer is provided in a position corresponding to the source, a position corresponding to the drain or a position between the gate and the drain.

Optionally, when the seed layer is provided in a position corresponding to the drain, a current blocking layer is further formed on the seed layer.

Optionally, when an HEMT device is formed, N-type doping is performed for the source region and the drain region; and when an HHMT device is formed, P-type doping is performed for the source region and the drain region.

Optionally, a dielectric layer is formed on a side surface and a bottom surface of the groove.

According to another aspect of the present disclosure, a semiconductor device is provided, including:
- a substrate,
  wherein the substrate has a side surface in a hexagonal symmetrical lattice structure;
- a single crystal seed layer;
- a channel layer grown with the seed layer as a core, wherein the channel layer protrudes from an upper surface of the substrate;
- a barrier layer formed on the protruding channel layer;
- a two-dimensional electron gas and immovable background positive charges formed on a first face of the channel layer, and/or a two-dimensional hole gas and immovable background negative charges formed on a second face of the channel layer; and
- a source, a gate, and a drain formed on the first face/the second face of the channel layer, and a bottom electrode formed on the second face/first face of the channel layer,
  wherein when the bottom electrode is formed on the second face of the channel layer, an HEMT device is formed; and when the bottom electrode is formed on the first face of the channel layer, an HHMT device is formed.

Optionally, a first channel layer, a first adjusting layer, and a second channel layer are used to replace the channel layer.

Optionally, a first channel layer, a second adjusting layer, and a second channel layer are used to replace the channel layer.

Optionally, a first channel layer, a first adjusting layer, a second adjusting layer, and a second channel layer are used to replace the channel layer.

Optionally, the bottom electrode is at least connected to one of the first adjusting layer, the second adjusting layer, the two-dimensional electron gas, and the two-dimensional hole gas, so as to adjust the electric field distribution of the device.

Optionally, the bottom electrode is formed on the second face of the channel layer, and the first/second adjusting layer has P-type doping; alternatively, the bottom electrode is formed on the first face of the channel layer, and the first/second adjusting layer has N-type doping.

Optionally, a doping concentration in the first adjusting layer is less than $5E18/cm^3$; and a doping concentration in the second adjusting layer is $1E17-5E19/cm^3$.

Optionally, the source, the gate, and the drain are provided to be coplanar or non-coplanar.

Optionally, a buffer layer is further provided on the seed layer.

Optionally, the seed layer is provided in a position corresponding to the source, a position corresponding to the drain or a position between the gate and the drain.

Optionally, when the seed layer is provided in a position corresponding to the drain, a current blocking layer is formed on the seed layer.

Optionally, when an HEMT device is formed, N-type doping is further provided for the source region and the drain region; and when an HHMT device is formed, P-type doping is further provided for the source region and the drain region.

Optionally, a dielectric layer is further provided on a side wall and a bottom surface of the groove.

According to another aspect of the present disclosure, a complementary semiconductor device is provided, including any semiconductor device in the preceding.

According to another aspect of the present disclosure, a radio frequency device is provided, including any semiconductor device in the preceding.

According to another aspect of the present disclosure, an electric power device is provided, including any semiconductor device in the preceding.

BRIEF DESCRIPTION OF DRAWINGS

Specific contents of the present disclosure are described in the following with reference to the accompanying drawings, which will help to more easily understand the above and other objectives, features, and advantages of the present disclosure. It should be understood that the accompanying drawings are merely intended to illustrate the principles of the present disclosure. In the accompanying drawings, it is not necessary to draw the size and relative positions of the units according to scale. In the accompanying drawings.

DETAILED DESCRIPTION OF EMBODIMENTS

Figure 1:
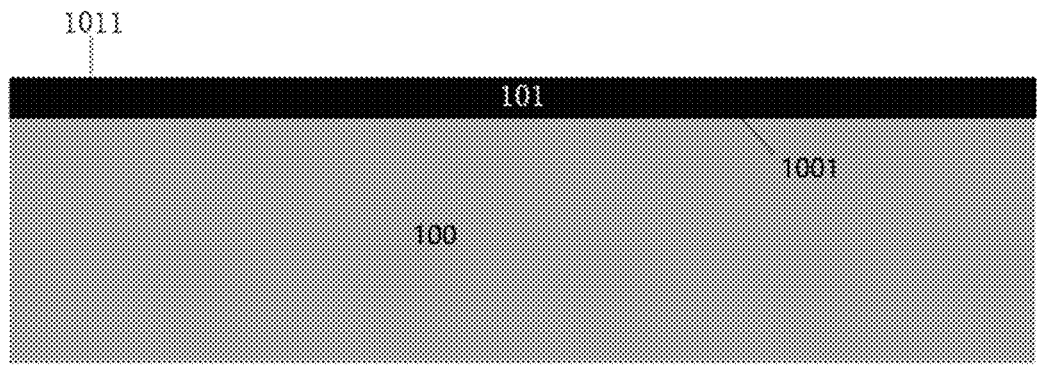
FIGS. 1-15 are schematic views of a semiconductor device structure and a manufacturing method thereof according to an embodiment.

Exemplary contents disclosed in the present disclosure will be described below in conjunction with accompanying drawings. For the sake of clarity and conciseness, not all features that realize the present disclosure are described in the description. However, it should be appreciated that many modes that can implement the present disclosure may be made in the course of realizing the present disclosure so as to achieve the developer's specific objectives, and these modes may vary with differences of the present disclosure.

It is also to be noted herein that, in order to avoid complicating the present disclosure with unnecessary details, only device structures closely related to the solution according to the present disclosure are shown in the accompanying drawings, and some details are omitted.

It should be understood that the contents in the present disclosure are not merely limited to the embodiments described although the following descriptions are made with reference to the accompanying drawings. In the present disclosure, features between different embodiments may be substituted or combined, or one or more features may be omitted in one embodiment, where feasible.

The accompanying drawings may be referred to in the following specific embodiments, and the drawings show a part of the present disclosure and illustrate exemplary embodiments. In addition, it should be understood that other embodiments may be utilized to make structural and/or logical changes without departing from the scope of the claimed subject matter. It should also be pointed out that the directions and positions (for example, up, down, top, bottom) are only used to help understanding the features in the drawings, while it is not intended to merely adopt the following specific embodiments in a restrictive sense.

As used in the specification and appended claims of the present disclosure, unless the context clearly dictates otherwise, terms "a (an)", "one", and "the" also include plural forms. It will also be understood that the term "and/or" as used herein refers to and includes any and all possible combinations of one or more of the associated listed items.

Specifically, the semiconductor device in the contents of the present disclosure is a compound semiconductor device containing a nitride semiconductor material, also called as nitride semiconductor device, wherein the nitride semiconductor device is a group III nitride semiconductor device. Further, the group III nitride semiconductor device includes a transistor using a wurtzite group III nitride semiconductor material. Further, the transistor includes a GaN transistor of a GaN semiconductor material. In particular, the GaN transistor is a normally off transistor GaN-HEMT and/or GaN-HHMT.

Below, a semiconductor device and a manufacturing method thereof according to an embodiment are described with reference to FIGS. 1-15.

As shown in FIGS. 1-15, the semiconductor device includes a substrate 100. A material of the substrate 100 may be selected according to actual needs, and the present disclosure does not limit the specific material of the substrate 100, as long as the substrate material can satisfy that a side surface of a vertical groove formed perpendicular to a surface of the substrate has a hexagonal symmetrical lattice structure. Exemplarily, the material of the substrate 100 may be Si, $Al_2O_3$, SiC, GaN, or the like.

Figure 5:
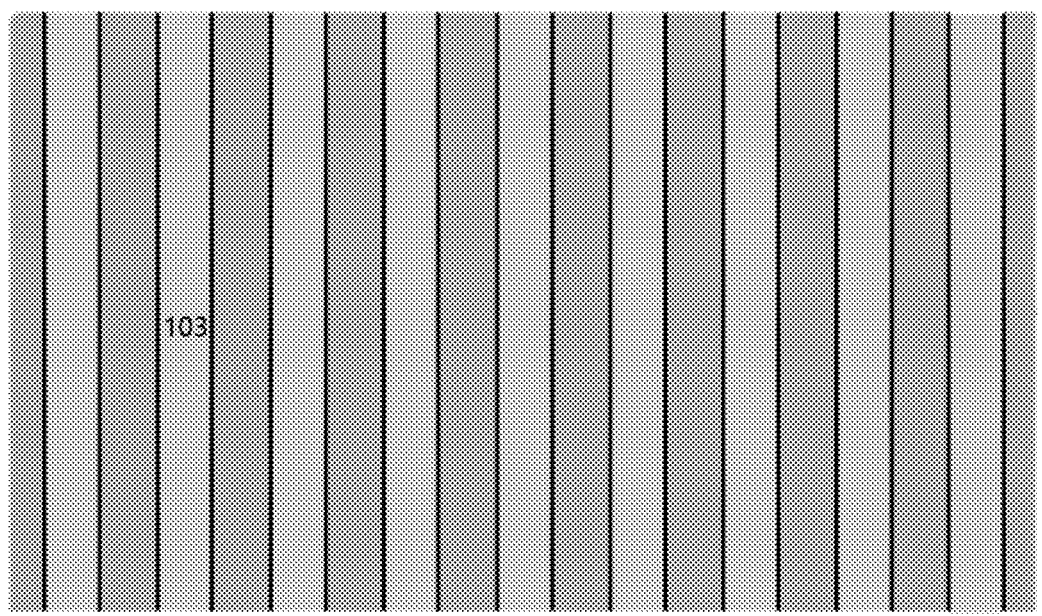
Figure 6:
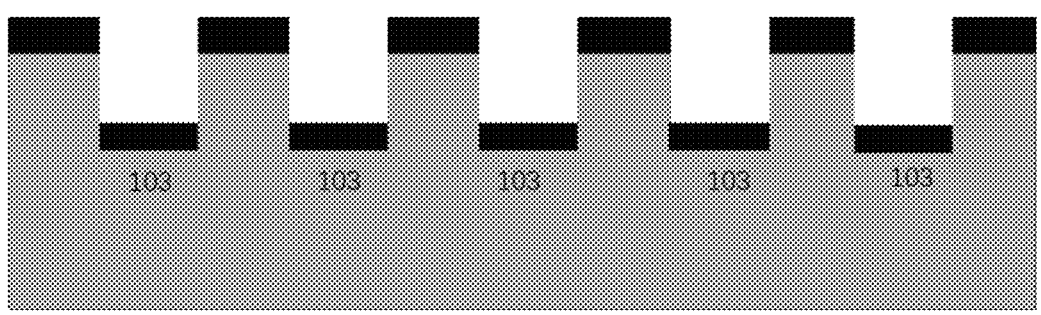
Figure 7:
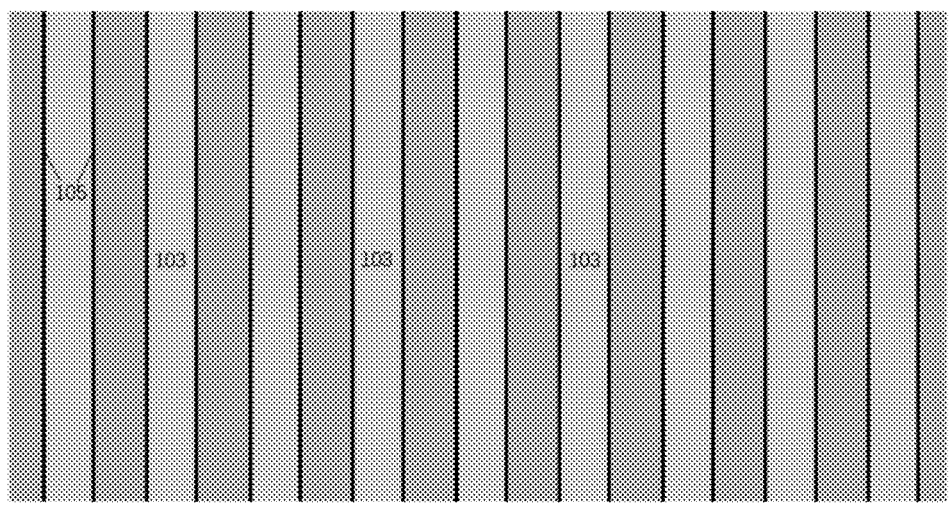
Figure 8:
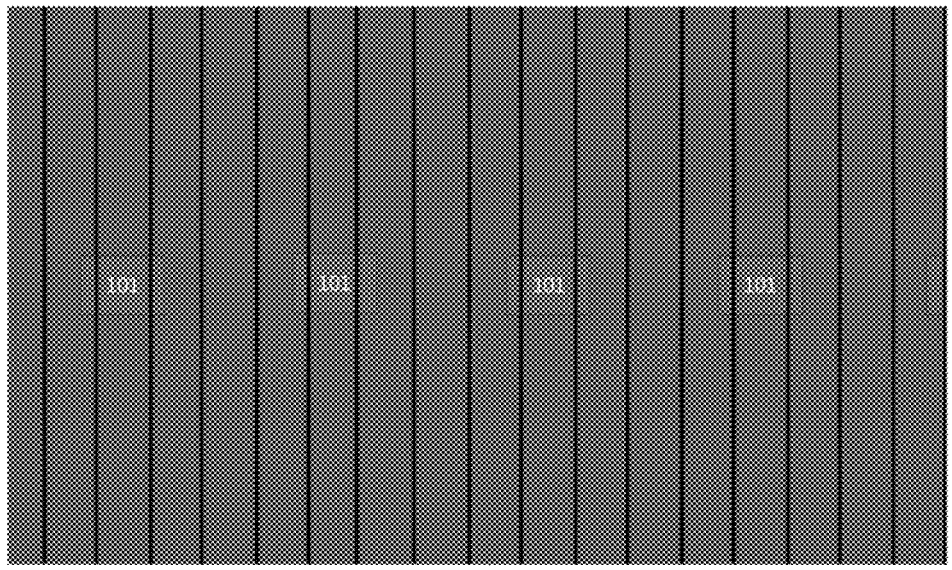
Figure 9:
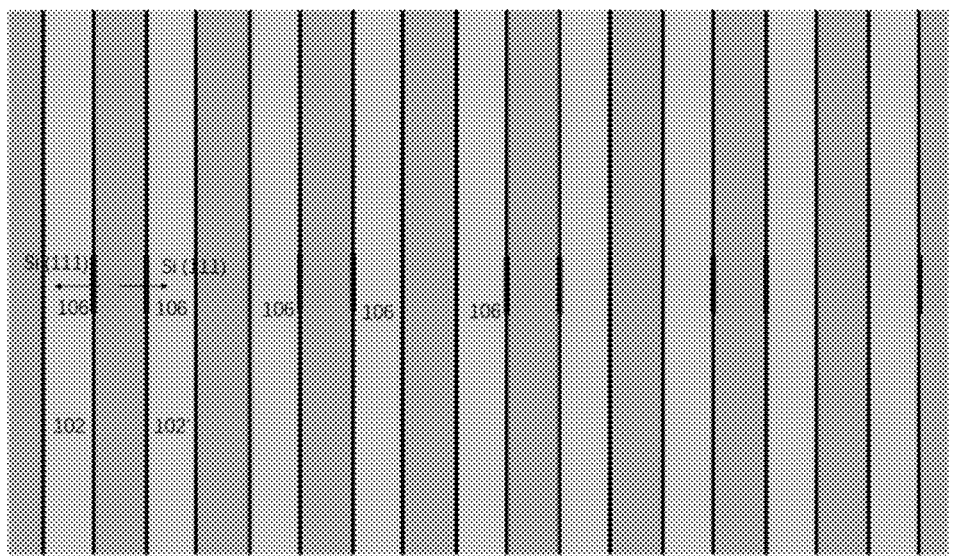
Figure 10:
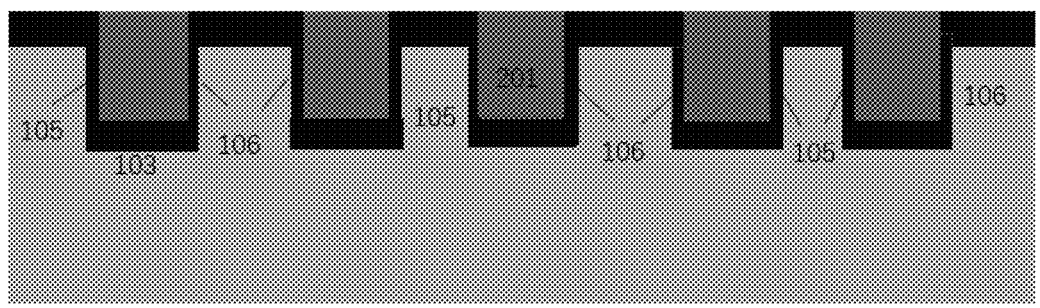

Since a silicon substrate has the advantages of low price, strong fabricability, etc., further description is made in the present disclosure by taking the Si substrate as an example. Exemplarily, a single crystal silicon substrate may be a silicon substrate employing either (110) or (112) face. As shown in FIG. 1, the substrate 100 having a first surface 1001 is provided; a first dielectric layer 101 is formed on the first surface 1001 of the substrate 100. Exemplarily, the first dielectric layer 101 is a $SiO_2$ layer formed by thermal oxidation or vapor deposition. Exemplarily, the thickness of the first dielectric layer 101 is about 0.5 micrometers. It should be noted that the numerical ranges and so on in the present disclosure are only used as examples and are not limitation to the present disclosure. The first dielectric layer 101 has a first surface 1011 parallel to the first surface 1001 of the substrate. A plurality of vertical grooves are formed by etching a part of the first dielectric layer 101 and the substrate 100 below the first dielectric layer. Specifically, the grooves include first grooves 102 and second grooves 102' arranged at intervals, and the first grooves and the second grooves are the same in structure and size. Exemplarily, the first grooves and the second grooves have a depth of about 5 micrometers. Lower portions of a first surface 1021 and a second surface 1022 of each groove are respectively constituted by exposed second surface 1002 and third surface 1003 of the substrate, wherein the second surface 1002 and the third surface 1003 of the substrate have a hexagonal symmetrical lattice structure, for example, Si (111) face. It may be understood that the second surface and the third surface of the substrate further may be $Al_2O_3$ (0001) face, SiC (0001) face, SiC (000$\bar{1}$) face, GaN (0001) face, or GaN (000$\bar{1}$) face, and the like. Upper portions of the first surface 1021 and the second surface 1022 of each groove are respectively constituted by a second surface 1012 and a third surface 1013 of the first dielectric layer 101. As shown in FIGS. 5 and 6, a second dielectric layer 103 is formed on the third surface 1023 of each groove, and exemplarily, the second dielectric layer 103 may be a silicon dioxide layer formed by oxidation, and exemplarily, it has a thickness of about 500 nm. As shown in FIG. 7, a fourth dielectric layer 105 is formed on the first surface 1021 and the second surface 1022 of each groove, and exemplarily, the thickness of the fourth dielectric layer is about 100 nm, and the fourth dielectric layer can avoid the interaction between the silicon substrate and a Ga-containing precursor during epitaxy, and meanwhile is more advantageous for improving the selectivity during the epitaxy. Further, as shown in FIGS. 8 and 9, a part of the fourth dielectric layer 105 on the second surface of the first groove and on the first surface of the second groove is removed, and a single crystal seed layer 106 is formed on the exposed third surface 1003 of the substrate 100 in the first groove and on the exposed second surface 1002 of the substrate 100 in the second groove. Exemplarily, the single crystal seed layer is an ALN layer, and a growth direction of ALN crystal is a <0001> direction, and a surface thereof is a (0001) face. Exemplarily, a position where the single crystal seed layer is located corresponds to a subsequent formation position of a source of the device. As when the device structure formed subsequently uses the source as a reference point, the semiconductor device structure can exhibit a symmetrical structure, and a source region has a very low voltage, and then is insensitive to the crystal quality, the influence of poor crystal quality in a nucleation region is minimized. Then, as shown in FIG. 10, a channel layer 201 is selectively grown with the seed layer 106 as a core, and the channel layer 201 may be a nitride, exemplarily, for example, an intrinsic GaN (i-GaN) or non-intentionally doped GaN layer. Due to the presence of the grooves 102, the channel layer 201 starts to be grown from the seed layer along the grooves 102, wherein the growth includes growth in a first direction along the grooves, and also includes growth in a second direction perpendicular to the grooves, and the channel layer 201 further may be grown outside the grooves, and the channel layer 201 outside the grooves is removed by a planarization or etching technique.

Figure 11:
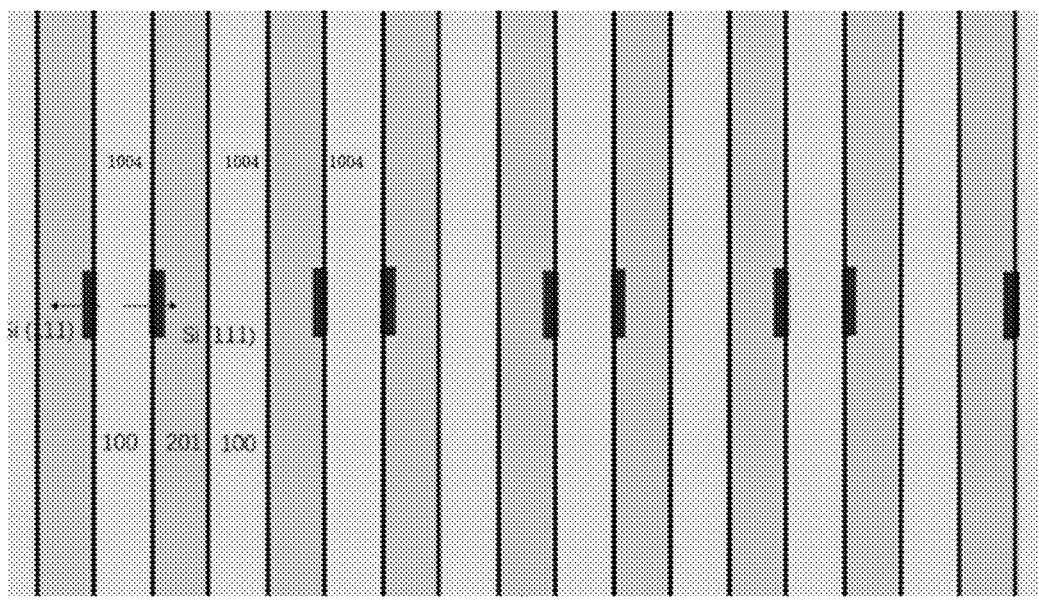
Figure 12:
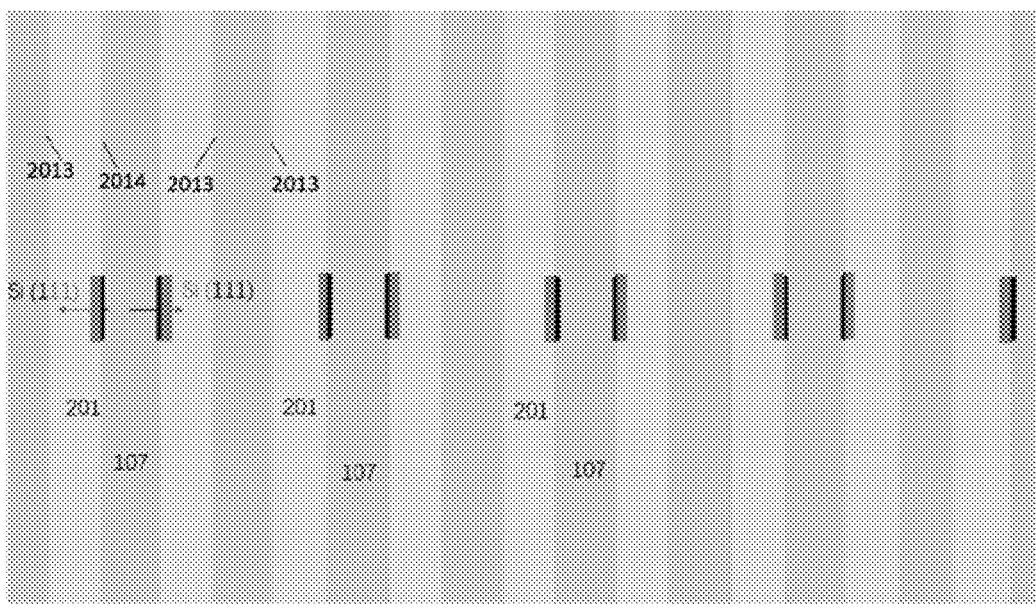
Figure 13:
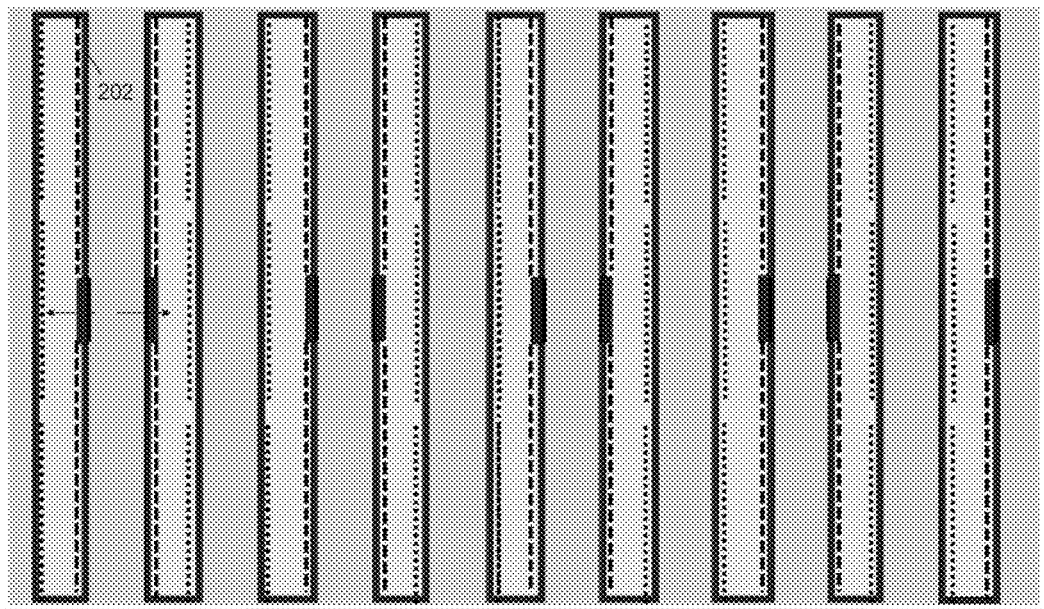

As shown in FIG. 11, two sides of the channel layer are etched to remove the first dielectric layer 101 and a part of the substrate 100, so that the channel layer 201 protrudes from a fourth surface 1004 of the etched substrate 100. The channel layer 201 has a first face 2013 having a spontaneous polarization effect and a piezoelectric polarization effect and a second face 2014, opposite to the first face, having a spontaneous polarization effect and a piezoelectric polarization effect. When the channel layer is GaN, the first face 2013 is a (0001) face, and the second face 2014 is a (000$\bar{1}$) face. As shown in FIG. 12, a third dielectric layer 107 is formed on the etched substrate 100 to isolate the exposed silicon substrate. Exemplarily, as shown in FIG. 13, the third dielectric layer may be a silicon dioxide layer. Then, a barrier layer 202 is formed in a manner of covering the channel layer 201, wherein the barrier layer may be an AlN layer or an AlGaN layer, and further a two-dimensional electron gas 2DEG and a two-dimensional hole gas 2DHG are respectively formed on the first face 2013 and the second face 2014 of the channel layer, and correspondingly there are also immovable background positive charges and background negative charges at an interface, wherein the background positive charges attract the two-dimensional electron gas 2DEG, and the background negative charges attract the two-dimensional hole gas 2DHG, that is, a complementary vertical channel device structure is formed.

Figure 14:
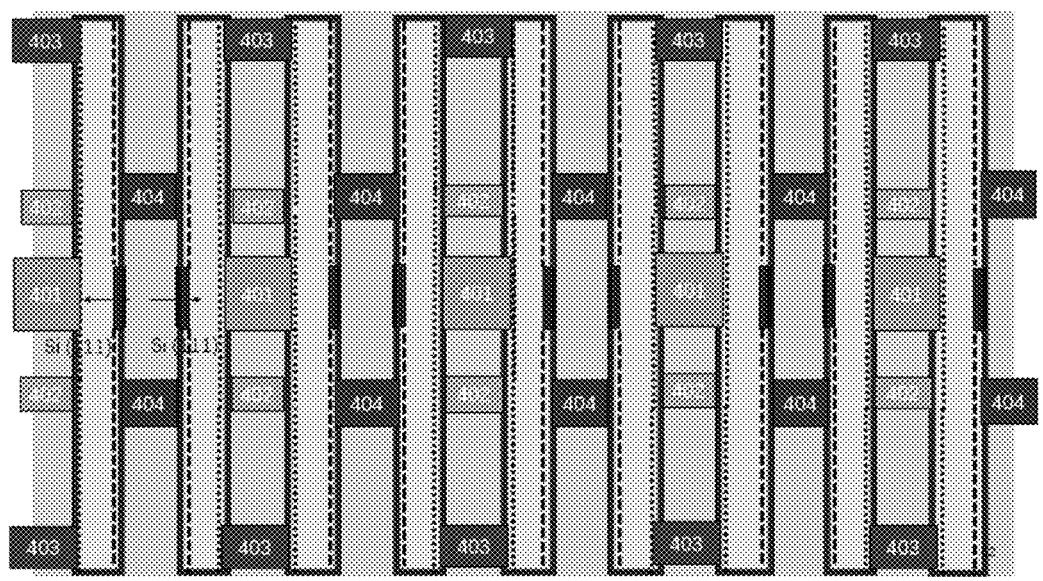

Then, as shown in FIG. 14, a source 401, a gate 402, a drain 403, and a bottom electrode 404 are respectively formed on the barrier layer 202 in a direction along the length of the channel. It may be understood that, when the formed device is HEMT, the source and the drain also may be formed on the channel 201 along a transmission direction of the two-dimensional electron gas, and the bottom electrode is in electrical contact with the two-dimensional hole gas; and when the formed device is HHMT, the source and the drain may also be formed on the channel 201 along a transmission direction of the two-dimensional hole gas, and the bottom electrode is in electrical contact with the two-dimensional electron gas. The bottom electrode may be an independently controlled electrode, and may also be electrically connected to the source or the gate. The bottom electrode may be located between the gate and the drain, or between the source and the gate, or below the gate.

Due to the presence of the grooves, the channel layer may be grown very straightly during the lateral epitaxial growth, and further a vertical surface of the subsequent semiconductor device including the channel layer may be formed quite straightly with the aid of the grooves, so that a relatively high aspect ratio is easily achieved. More specifically, when the channel layer 201 is used as a vertical channel, a higher channel density may be realized on a unit area, thereby reducing the resistance of the device, and improving the performance of the device.

Figure 15:
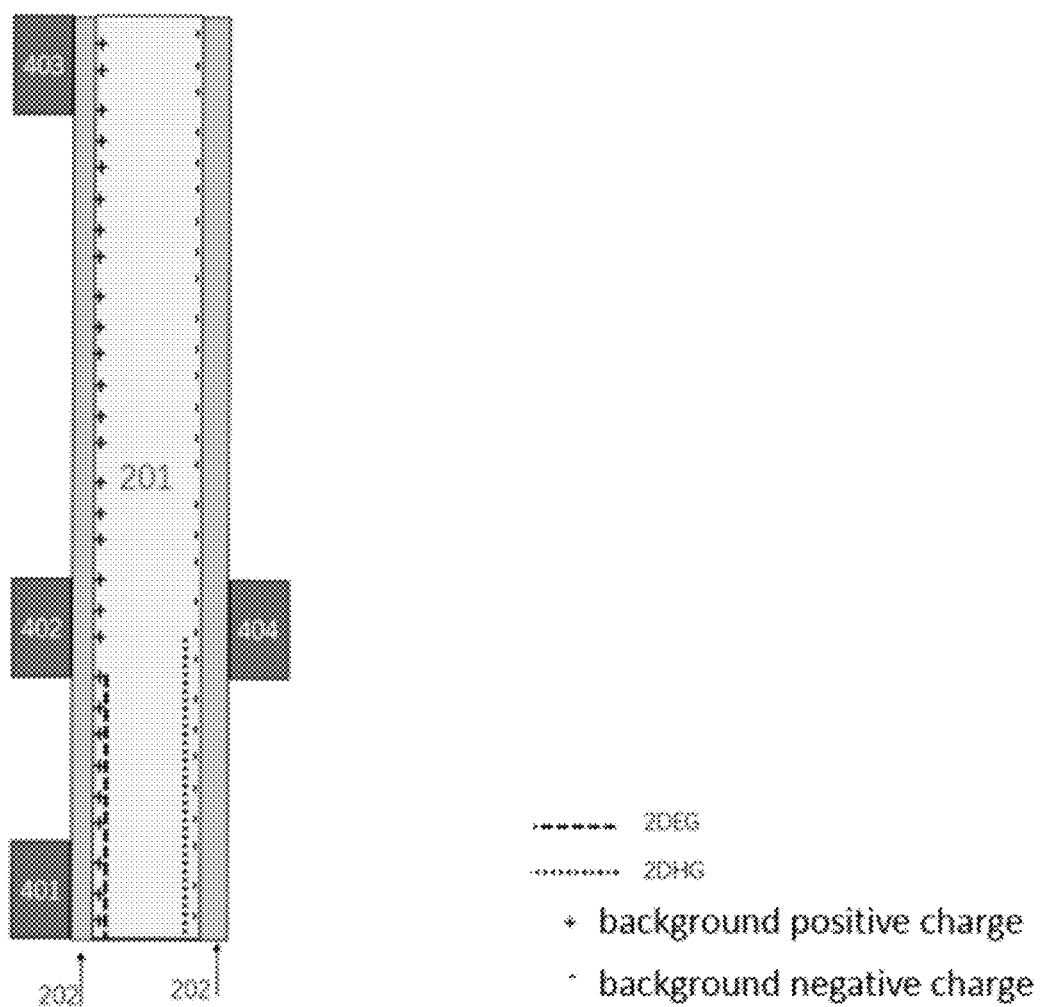
Figure 16:
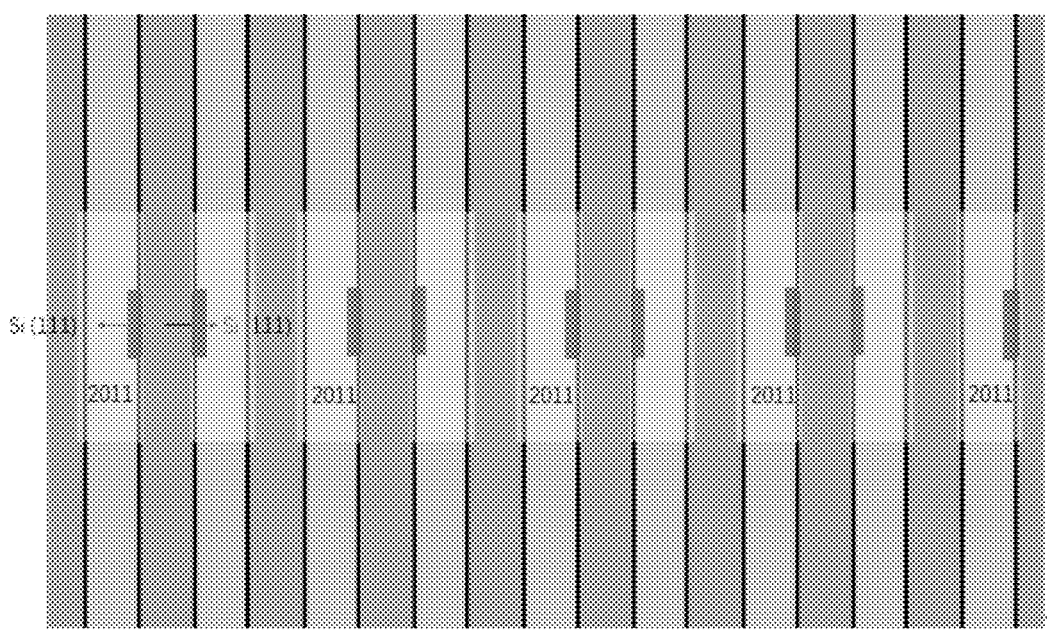
FIGS. 16-19 are schematic views of an optional semiconductor device structure and a manufacturing method thereof.
Figure 17:
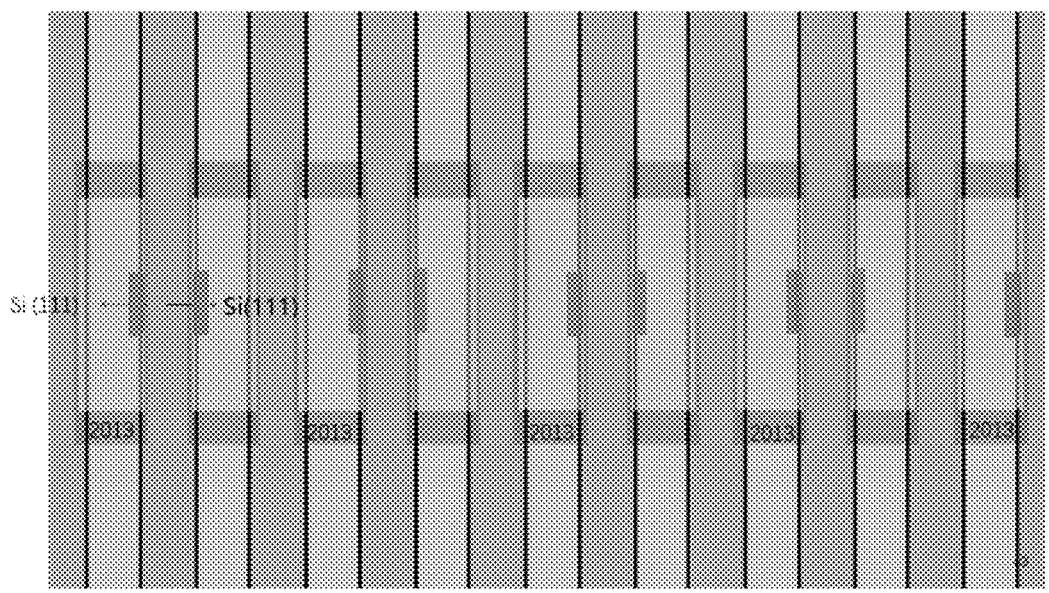
Figure 18:
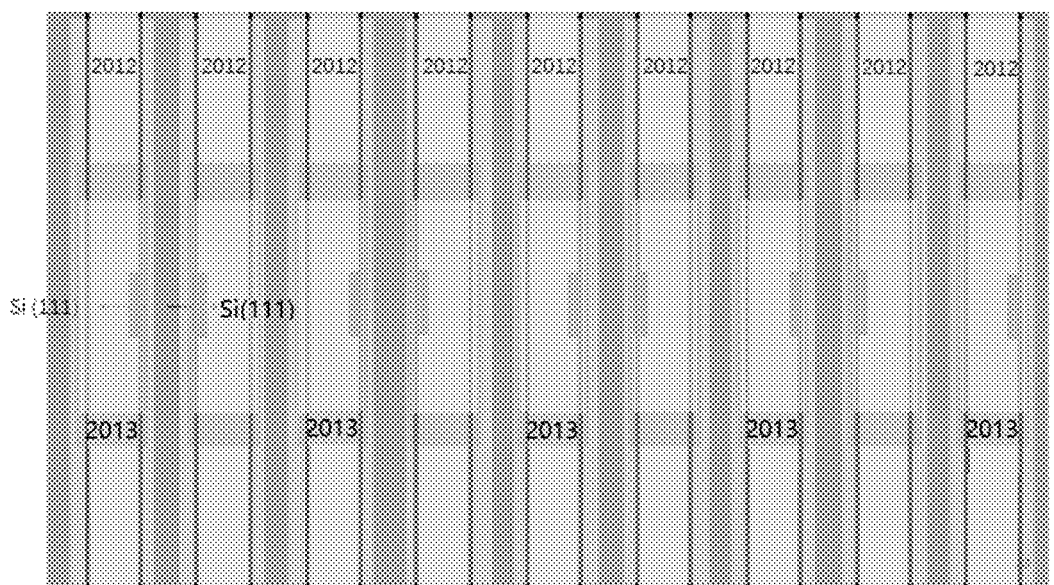
Figure 19:
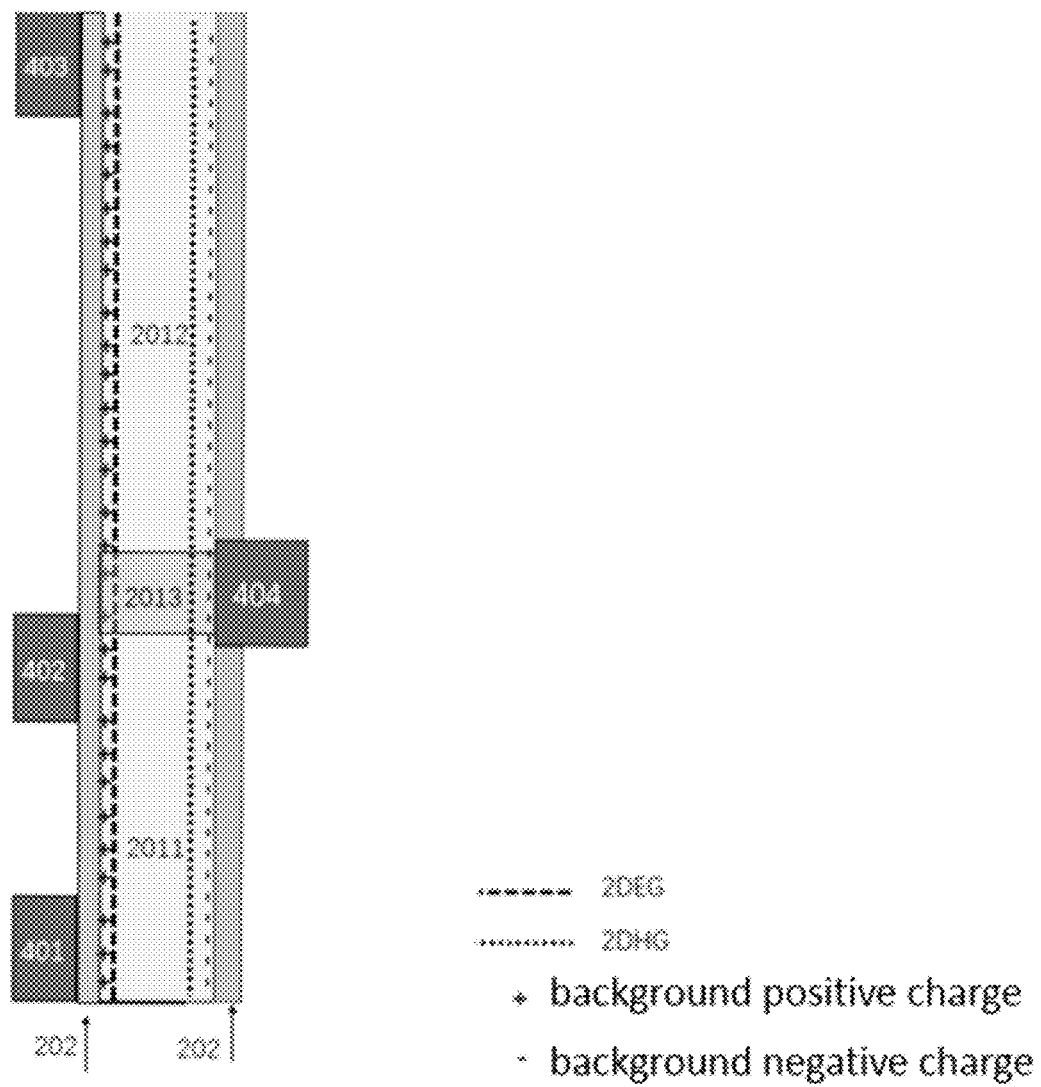
Figure 20:
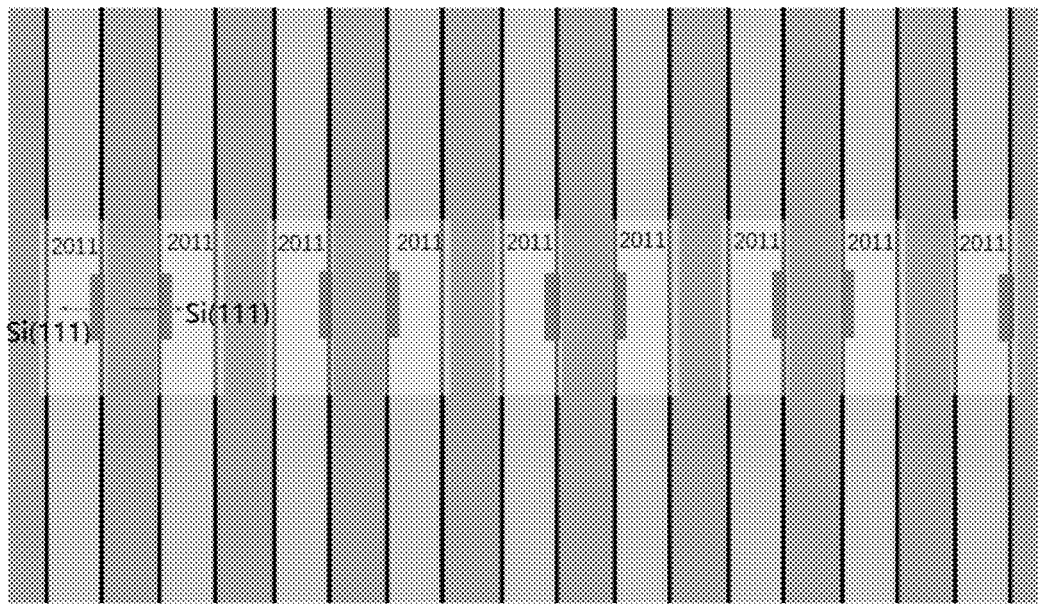
FIGS. 20-23 are schematic views of an optional semiconductor device structure and a manufacturing method thereof.
Figure 21:
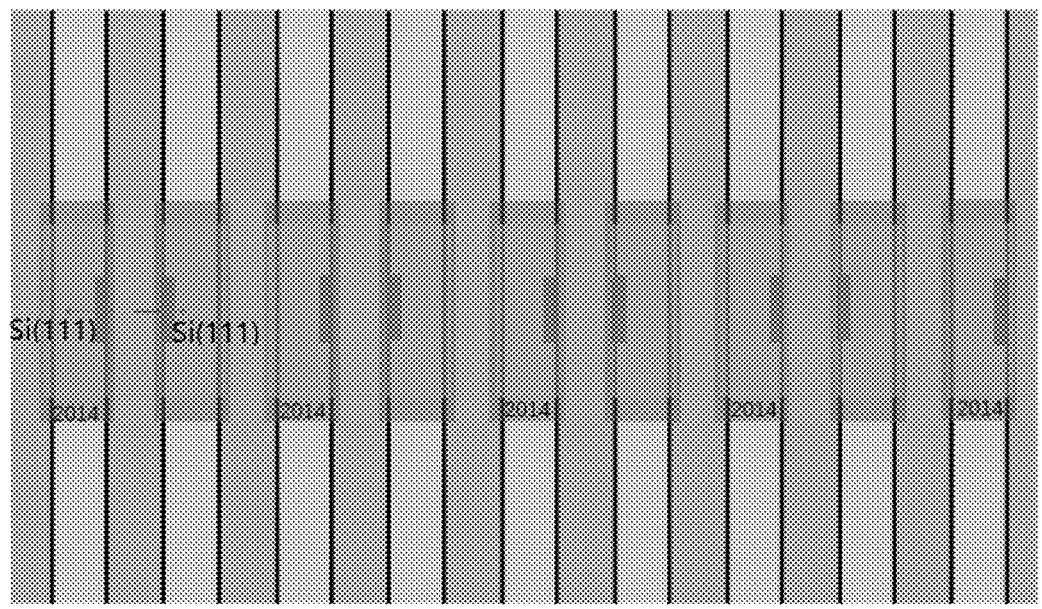
Figure 22:
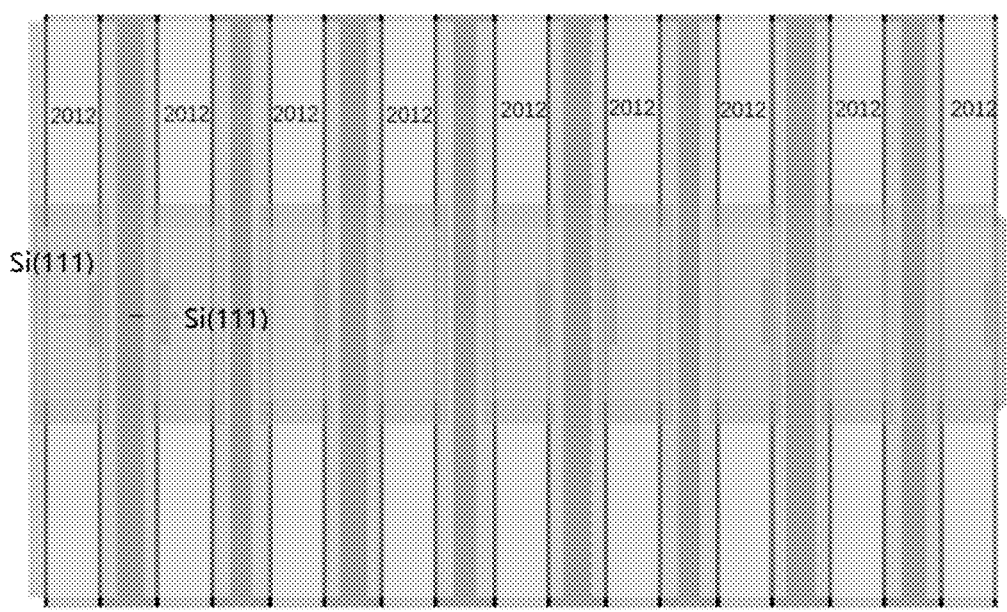
Figure 23:
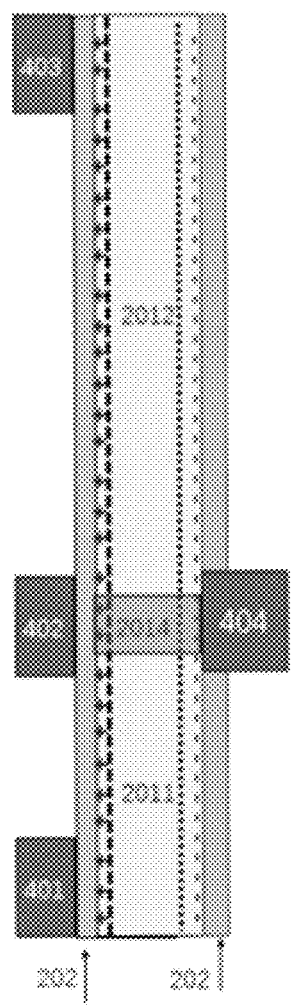
Figure 24:
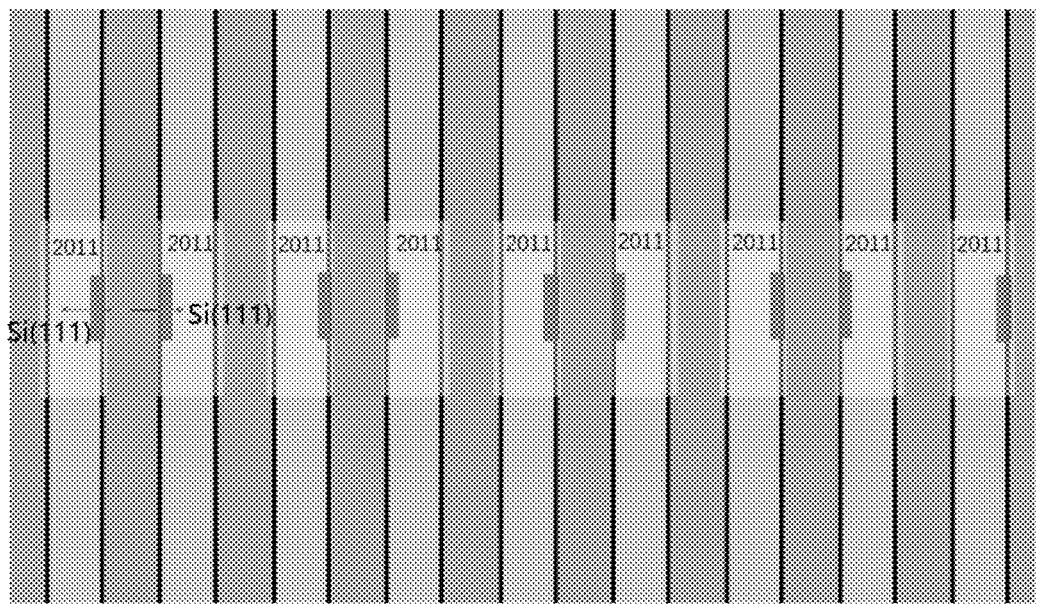
FIGS. 24-28 are schematic views of an optional semiconductor device structure and a manufacturing method thereof.

Herein, an HEMT (high electron mobility transistor) is taken as an example for illustration. After the bottom electrode 404 is provided, when the device is on, as shown in FIG. 15, a current flows in a direction from the drain 403 to the source 401 (electrons flow in a direction from the source 401 to the drain 403), at this time, the arrangement of the bottom electrode 404 substantially has no influence on the flow of current; and when the device is off, the drain 403 is at a high voltage, at this time, the channel is off, and the two-dimensional electron gas from the gate 402 to the drain 403 is depleted due to the presence of high voltage of the drain 403, and then only the background positive charges are left. Meanwhile, as the voltage provided for the bottom electrode is much lower than the voltage of the drain, the 2DHG connected to the bottom electrode is also partially depleted under the action of the electric field, the background negative charges are left, and the background negative charges may generate an electric field, so as to counteract a part of the electric field in the 2DEG. The background negative charges and the background positive charges that are left make the distribution of the electric field more uniform, thus achieving the purpose of reducing the local electric field intensity. For the HHMT (high hole mobility transistor) device, similarly to the HEMT device, when the device is on, the current flows in a direction from the drain to the source (the hole flows from the drain to the source). At this time, the arrangement of the bottom electrode substantially has no influence on the flow of current. When the device is off, the drain is at a high negative voltage, and at this time, as the channel is off, the 2DHG from the gate to the drain is depleted, and only the background negative charges are left. At this time, as the bottom electrode voltage is much higher than the drain voltage, the 2DEG connected to the bottom electrode is also partially depleted under the action of the electric field, and the background positive charges are left. These background positive charges may partially counteract the electric field of the background negative charges of the 2DHG channel layer, so that the distribution of the electric field is more uniform.

A method for manufacturing the semiconductor device is now described in detail with reference to FIGS. 1-14, in which FIGS. 1, 2, 6, and 10 are sectional views, and FIGS. 3-5, 7-9, and 11-14 are top views.

Step 1: as shown in FIG. 1, a substrate 100 is provided, and the substrate may be a silicon substrate employing either (110) or (112) face. A first dielectric layer 101 is formed on a first surface 1001 of the substrate 100, and exemplarily, the first dielectric layer 101 is a $SiO_2$ layer formed by thermal oxidation or vapor deposition. Exemplarily, the first dielectric layer 101 has a thickness of about 0.5 micrometers.

Figure 2:
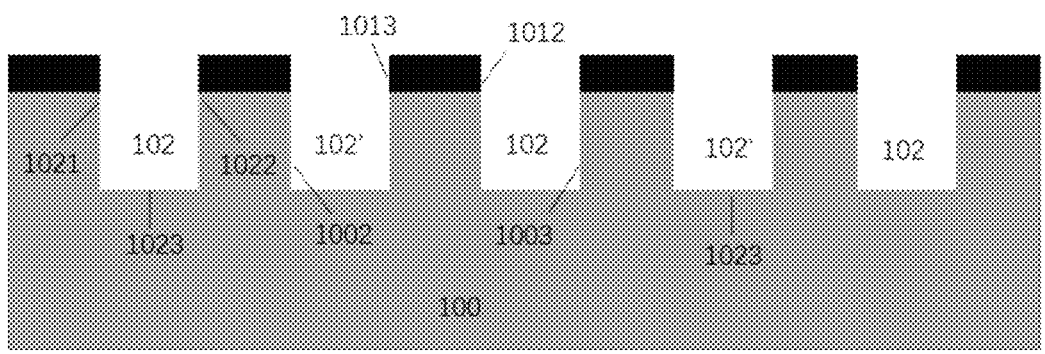

Step 2: as shown in FIG. 2, photolithography is performed on the first dielectric layer 101 at intervals so as to expose a part of the interior of the first dielectric layer 101, and then the first dielectric layer 101 and the substrate 100 below the first dielectric layer are etched at photolithography positions, to form vertical grooves, wherein the grooves include first grooves 102 and second grooves 102' arranged at intervals. Lower portions of two side surfaces, i.e., the first surface 1021 and the second surface 1022, of each groove are respectively constituted by a second surface 1002 and a third surface 1003 exposed after the substrate is etched. The second surface 1002 and the third surface 1003 of the substrate have a hexagonal symmetrical lattice structure, for example, Si (111) face. The second surface and the third surface of the substrate further may be $Al_2O_3$ (0001) face, SiC (0001) face, SiC (000$\bar{1}$) face, GaN (0001) face, or GaN (000$\bar{1}$) face, and the like.

Figure 3:
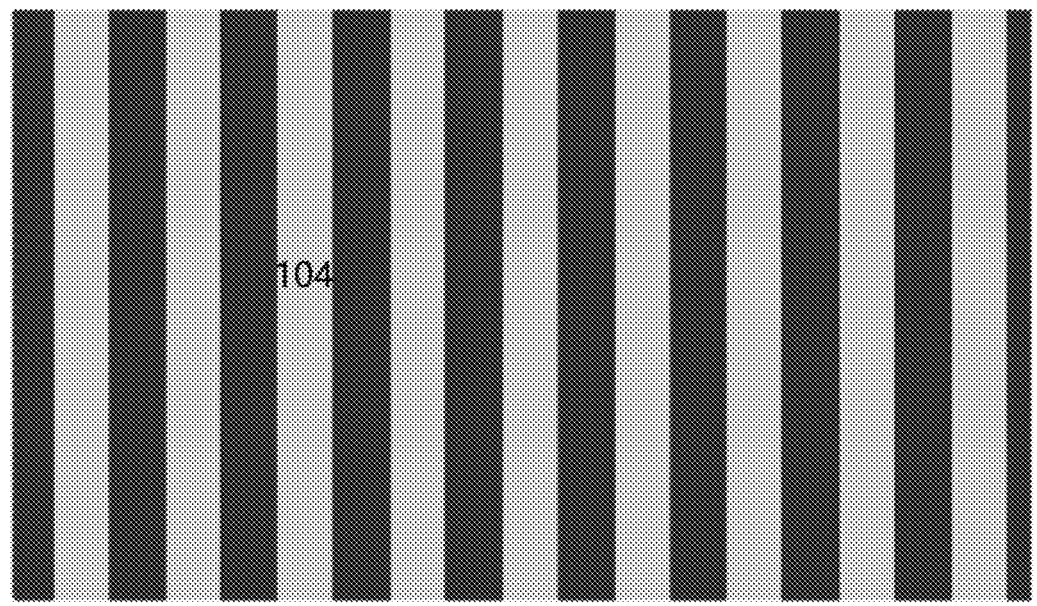

Step 3: as shown in FIG. 3, on the basis of the structure formed in step 2, a sacrificial layer 104 is formed by coplanar deposition, and exemplarily, the sacrificial layer 104 is a silicon nitride layer, and it has a thickness of about 100 nanometers. It may be understood that the first dielectric layer and the sacrificial layer may be selected as long as the two have a high etching selectivity ratio, for example, when etching the sacrificial layer, an etchant substantially does not etch the first dielectric layer, or etches the first dielectric layer extremely slow.

Figure 4:
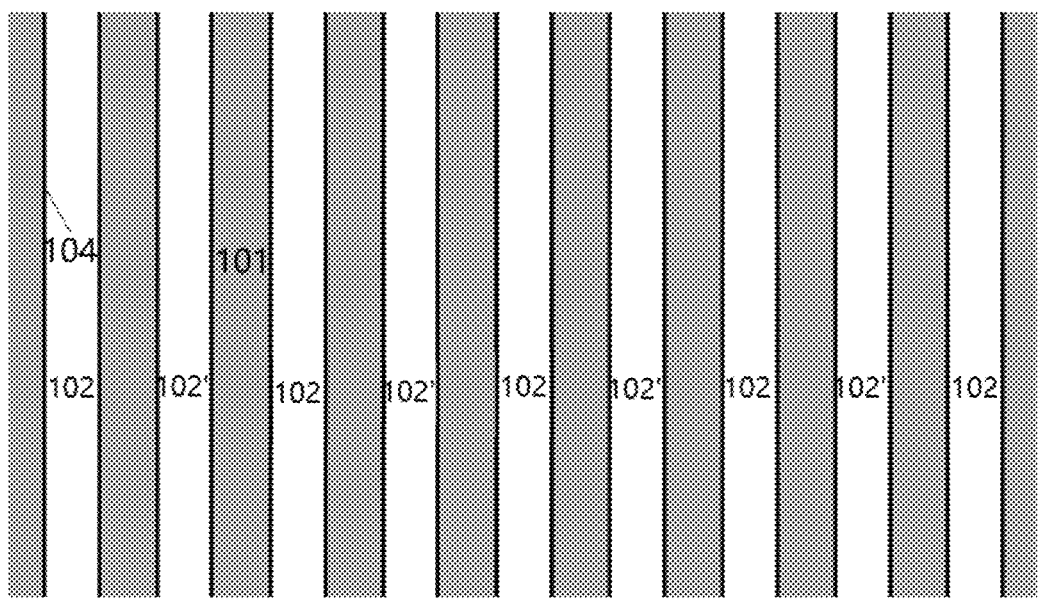

Step 4: as shown in FIG. 4, dry etching is performed, to remove the sacrificial layer 104 on the first surface 1011 of the first dielectric layer 101 and the sacrificial layer 104 on the third surface 1023 of the groove 102, 102', and the sacrificial layer 104 on the first surface 1021 and the second surface 1022 of each groove 102 (102') is retained.

Step 5: as shown in FIG. 5, a second dielectric layer 103 (a silicon dioxide layer) is formed on the third surface 1023 of each groove through an oxidation process, wherein the first surface and the second surface of the groove are not oxidized due to the protection of the retained sacrificial layer 104, and the second dielectric layer may avoid incompatibility between gallium atoms and the silicon substrate during subsequent growth of the nitride semiconductor, thus avoiding the melt-back phenomenon. Meanwhile, the second dielectric layer further may effectively block a leakage current between the nitride semiconductor and the silicon substrate, and reduce the parasitic capacitance brought by the silicon substrate.

Step 6: as shown in FIG. 6, the sacrificial layer 104 on the first surface and the second surface of each groove is removed by selective wet etching by utilizing an etching selectivity ratio of the sacrificial layer 104 to the second dielectric layer 103 (silicon dioxide layer).

Step 7: as shown in FIG. 7, a thinner fourth dielectric layer 105 (a silicon dioxide layer) is respectively formed on the first surface and the second surface of each groove 102 through an oxidation process, so that the thickness of the fourth dielectric layer and the thicknesses of the first and second dielectric layers are set differently, so that when the fourth dielectric layer is subsequently removed, there are still sufficiently thick first and second dielectric layers to protect the substrate. These dielectric layers may avoid incompatibility between the gallium atoms and the silicon substrate during subsequent growth of the nitride semiconductor, and thus avoid the melt-back phenomenon.

Step 8: as shown in FIG. 8, a photoresist is coated, and a photolithographic pattern is formed between the first groove and the second groove to expose a part of the first dielectric layer 101 between the first groove and the second groove. It may be understood that the photolithographic pattern may expose the whole first dielectric layer 101 between the first groove and the second groove.

Step 9, as shown in FIG. 9, the exposed fourth dielectric layer 105 on the second surface of the first groove and on the first surface of the second groove is removed, wherein as the first dielectric layer is much thicker than the fourth dielectric layer, in the process of removing a part of the fourth dielectric layer, the exposed part of the first dielectric layer is only etched by a small thickness and is not completely removed, then the photoresist is removed, so that the third surface 1003 of a part of the substrate 100 is exposed in the first groove and the second surface 1002 of a part of the substrate 100 is exposed in the second groove.

Step 10: as shown in FIG. 9, due to the melt-back effect between the silicon substrate and gallium, the GaN cannot be directly deposited on the silicon substrate. Generally, a seed layer of AlN needs to be deposited first, and a subsequent nitride semiconductor structure is then formed on this basis. Therefore, a single crystal AlN seed layer 106 is formed on the exposed third surface 1003 of the substrate 100 in the first groove and on the exposed second surface 1002 of the substrate 100 in the second groove, respectively, and the growth direction of the single crystal AlN crystal is <0001>, and a surface is (0001) face. It should be noted that the selectivity of AlN is very low, and it is easy to also generate polycrystalline or amorphous AlN on the dielectric layer under common process conditions, which is disadvantageous for forming a desired structure. Therefore, it is necessary to additionally remove the AlN on the silicon dioxide layer after the seed layer is formed. Alternatively, a chlorine-containing gas is introduced while the AlN seed layer is grown so as to ensure growth only on the silicon substrate but not on the silicon dioxide layer.

It may be understood that if other substrates such as $Al_2O_3$ are used, the seed layer may also be GaN. In this case, nucleation only on the exposed surface of the substrate may be easily achieved through process adjustment.

Step 11: as shown in FIG. 10, a channel layer 201 is then epitaxially grown laterally with the seed layer 106 as a core. Due to the presence of the grooves 102, the channel layer 201 starts to be epitaxially grown laterally along the grooves 102 from the seed layer, wherein the growth includes growth in a first direction along the groove, and also includes growth in a second direction perpendicular to the groove, and the channel layer 201 further may be grown outside the grooves, and the channel layer 201 outside the grooves is removed by a planarization or etching technique. The lateral epitaxy may effectively improve the nitride semiconductor crystal quality in a lateral epitaxial region, and further improve the electrical performance of the device. Removing the channel layer outside the grooves may make the device in a restricted state during formation, which is advantageous for forming a specific structure and size, and helpful to form a device with a relatively high aspect ratio, thus providing a means for realizing a device with relatively high aspect ratio in addition to the adjustment of the growth process parameters, and as the growth of the channel layers in the grooves is restricted by the first surface and the second surface of the grooves, the growth process of the channel layer avoids the situation that they cannot be kept completely vertical or growth surfaces are not in the same plane, and a situation that a plurality of complex growth surfaces may appear, thus facilitating realizing the control over the device and the improvement on electrical performance. It may be understood that the growth of the channel layer 201 outside the grooves also may not be removed, and forms a part protruding from the grooves.

Step 12: as shown in FIG. 11, a photolithographic pattern is formed, all regions between adjacent first groove and second groove are exposed from the top, and the materials of the first dielectric layer 101 and a part of the substrate 100 in the regions are etched, so that the channel layer covered by the fourth dielectric layer in the groove 102 protrudes from the fourth surface 1004 of the etched substrate.

Step 13: as shown in FIG. 12, a third dielectric layer 107 is formed on the fourth surface 1004 of the etched substrate 100. Exemplarily, the third dielectric layer may be a silicon dioxide layer formed by oxidation, then, the fourth dielectric layer covering the channel layer 201 is removed, thus, the first face 2013 of the channel layer 201 having the spontaneous polarization effect and the piezoelectric effect and the second face 2014, opposite to the first face, having the spontaneous polarization effect and the piezoelectric polarization effect of the channel layer 201 are exposed.

Step 14: as shown in FIG. 13, a barrier layer 202 is formed by covering the channel layer 201. The barrier layer may be an AlN layer or an AlGaN layer, and further a two-dimensional electron gas 2DEG and a two-dimensional hole gas 2DHG are respectively formed on the first face 2013 and the second face 2014 of the channel layer.

It may be understood that before the channel layer is grown, the buffer layer may be formed first by deposition.

Step 15: as shown in FIG. 14, an insulating layer is deposited, photolithography is performed on the insulating layer, and then a metal is deposited on the insulating layer. For HEMT, a source 401 and a drain 403 are respectively formed at the first face of the channel layer 201 along a transmission direction of two-dimensional electron gas, and a gate 402 is formed on the barrier layer 202 along the transmission direction of two-dimensional electron gas, wherein the gate is located between the source and drain. Optionally, the source, the gate, and the drain are all formed on the barrier layer 202 along the transmission direction of two-dimensional electron gas. A bottom electrode 404 is formed at the second face where the two-dimensional hole gas is located. For HHMT, on the channel layer 201, the source and the drain are respectively formed at the second face along the transmission direction of two-dimensional hole gas, and the gate is formed on the barrier layer 202 along the transmission direction of two-dimensional hole gas, wherein the gate is located between the source and the drain. Optionally, the source, the gate, and the drain are all formed on the barrier layer 202 along the transmission direction of two-dimensional hole gas. The bottom electrode 404 is formed at the first face where the two-dimensional electron gas is located.

An optional semiconductor device and a manufacturing method thereof are described with reference to FIGS. 16-19. FIGS. 16-19 are all top views.

Optionally, a first sub-layer 2011 of the channel layer, a first adjusting layer 2013, and a second sub-layer 2012 of the channel layer are formed in the groove along the direction of the first surface and the second surface of the channel, and the first sub-layer 2011 of the channel layer, the first adjusting layer 2013, and the second sub-layer 2012 of the channel layer completely fill the groove and the various layers are enabled to be parallel to the first surface of the channel layer and coplanar. It may be understood that the first adjusting layer may have P-type doping, or N-type doping, and exemplarily, the P-type doping is P-type GaN, and the N-type doping is N-type GaN. Exemplarily, the doping concentration is less than $5E18/cm^3$, whether to specifically select the P-type doping or the N-type doping depends on the specific type of the subsequent device. The P-type doping is selected for the HEMT device, and the N-type doping is selected for the HHMT device. It may be understood that the doping may be graded (gradually changed). Projection of the first adjusting layer on the first face of the channel layer falls within a range between the gate and the drain, or partially overlaps with projection of the gate in this direction.

In the above, the doped first adjusting layer is provided perpendicular or oblique to a side surface of the channel layer, and through the designed doping distribution, further responses to an externally applied electric field and changes the electric field distribution when the device is off, so that the local electric field intensity may be effectively reduced, particularly the electric field peak value of a terminal of the gate close to the drain may be reduced. The adjusting layer herein is preferably epitaxially grown laterally, which, compared with the ion implantation mode, will not cause problems such as ion implantation damage, and has good electrical properties.

When the device is in an off state, since the bottom electrode is electrically connected to the first adjusting layer, the situation that the potential of the doped layer (the electric field adjustment doped layer) between the gate and the drain for adjusting the electric field is unstable is avoided. It may be understood that it is also possible that the bottom electrode is not provided but the local electric field intensity is reduced only by a floating electric field adjustment doped layer.

It may be understood that, the bottom electrode is in electrical contact with the two-dimensional charge carrier gas and the first adjusting layer simultaneously, so that the doping of the first adjusting layer and one type of background charges in a complementary channel counteract a part of the effect of the electric field in another type of two-dimensional charge carrier, thus achieving the purpose of reducing the local electric field intensity.

A method for manufacturing the semiconductor device is described in detail below.

Step 11': as shown in FIGS. 16-19, after the seed layer 106 is formed, a first sub-layer 2011 of the channel layer is selectively grown with the seed layer 106 as a core. Due to the presence of the grooves 102, the first sub-layer 2011 starts to be epitaxially grown laterally along the grooves 102 from the seed layer, wherein the growth includes growth in a first direction along the first surface or the second surface of the groove, and growth perpendicular to the third surface of the groove. Then, taking the first sub-layer 2011 as a core, the doped first adjusting layer 2013 is grown, and the growth of the first adjusting layer 2013 includes growth in the first direction along the first surface or the second surface of the groove, and also includes growth in a second direction perpendicular to the first surface or the second surface of the groove, and growth perpendicular to the third surface of the groove. Projection of the first adjusting layer 2013 on the first face of the channel layer falls within a range between the gate and the drain, or partially overlaps projection of the gate in this direction.

Then, taking the first adjusting layer 2013 as a core, the second sub-layer 2012 of the channel layer is continuously grown, and the second sub-layer of the channel layer may be an intrinsic GaN layer or a non-intentionally doped GaN layer. The growth direction of the second sub-layer 2012 of the channel layer is the same as the growth direction of the first sub-layer or the first adjusting layer. Finally, a part of the first sub-layer, the first adjusting layer, and the second sub-layer grown perpendicular to the third surface of the groove and located outside the groove is removed by a planarization or etching technique, so that the first sub-layer, the first adjusting layer, and the second sub-layer are all located in the groove, thus forming a coplanar structure. The coplanar structure may make the device in a restricted state during formation, which is advantageous for forming a specific structure and size, and helpful to form a device with a relatively high aspect ratio, thus providing a means for realizing a high aspect ratio device in addition to the adjustment of the growth process parameters, and as the growth of the channel layer and the first adjusting layer in the grooves is restricted by the first surface and the second surface of the grooves, the growth process of the channel layer and the first adjusting layer avoids the situation that they cannot be kept completely vertical or growth surfaces are not in the same plane, and a situation that a plurality of complex growth surfaces may appear, thus facilitating realizing the control over the device and the improvement on electrical performance.

An optional semiconductor device and a manufacturing method thereof are described with reference to FIGS. 20-23. FIGS. 20-23 are top views.

Optionally, a first sub-layer 2011 of the channel layer, a second adjusting layer 2014, and a second sub-layer 2012 of the channel layer are formed in the groove along the direction of the first surface and the second surface of the channel, and the first sub-layer, the second adjusting layer 2014, and the second sub-layer 2012 completely fill the groove and the various layers are enabled to be parallel to the first surface of the channel and coplanar. The second adjusting layer is configured to control a threshold voltage. It may be understood that the second adjusting layer has P-type doping, or N-type doping, and exemplarily, the P-type doping is P-type GaN, and the N-type doping is N-type GaN. Exemplarily, the doping concentration of the second adjusting layer 2014 is $1E17$-$5E19/cm^3$, and more preferably, $1E+18/cm^3$-$5E+19/cm^3$. The P-type GaN layer may deplete the two-dimensional electron gas on the first face of the channel layer; and the N-type GaN layer may deplete the two-dimensional hole gas on the second face of the channel layer, further causing the device to be in a normally off state. Whether to specifically select the P-type doping or the N-type doping depends on the specific type of the subsequent device. The P-type doping is selected for the HEMT device, and the N-type doping is selected for the HHMT device. It may be understood that the doping may be graded. Projection of the second adjusting layer on the first face of the channel layer falls within a range of the gate. The doping concentration, dimensional parameter, etc. of the second adjusting layer may be set according to the device parameters, as long as 95%-100% of the two-dimensional electron gas or the two-dimensional hole gas above can be depleted. When the concentration of the two-dimensional charge carrier gas is higher, the corresponding doping concentration may be improved accordingly.

When the device is in the off state, the bottom electrode may be connected to the second adjusting layer and the two-dimensional carrier gas, or may be only connected to the two-dimensional carrier gas, when the HEMT device is formed, the bottom electrode is connected to the two-dimensional hole gas, and when the HHMT device is formed, the bottom electrode is connected to the two-dimensional electron gas. The connection manner of the bottom electrode enables the second adjusting layer and the two-dimensional carrier to cooperate or the two-dimensional carrier to act independently, thus avoiding the situation that the potential of the electric field adjustment doped layer is unstable.

A method for manufacturing the semiconductor device is described in detail below.

Step 11': as shown in FIGS. 20-23, after the seed layer 106 is formed, a first sub-layer 2011 of the channel layer is selectively grown with the seed layer 106 as a core. Due to the presence of the grooves 102, the first sub-layer 2011 starts to be epitaxially grown laterally along the grooves 102 from the seed layer, wherein the growth includes growth in a first direction along the first surface or the second surface of the groove, and growth perpendicular to the third surface of the groove. Then, taking the first sub-layer 2011 as a core, the doped second adjusting layer 2014 is grown, and the growth of the second adjusting layer 2014 includes growth in a first direction along the first surface or the second surface of the groove, and also includes growth in a second direction perpendicular to the first surface or the second surface of the groove, and growth perpendicular to the third surface of the groove. The second adjusting layer 2014 is located within a projection range of the gate in a projection direction of the subsequent device.

Then, taking the second adjusting layer 2014 as a core, the second sub-layer 2012 of the channel layer is continuously grown, and the second sub-layer of the channel layer may be an intrinsic GaN layer or a non-intentionally doped GaN layer. The growth direction of the second sub-layer 2012 of the channel layer is the same as the growth direction of the first sub-layer or the second adjusting layer. Finally, a part of the first sub-layer, the second adjusting layer, and the second sub-layer grown perpendicular to the third surface of the groove and located outside the groove is removed by a planarization or etching technique, so that the first sub-layer, the second adjusting layer, and the second sub-layer are all located in the groove, thus forming a coplanar structure. The coplanar structure may make the device in a restricted state during formation, which is advantageous for forming a specific structure and size, and helpful to form a device with a relatively high aspect ratio, thus providing a means for realizing a high aspect ratio device in addition to the adjustment of the growth process parameters, and as the growth of the channel layer and the second adjusting layer in the grooves is restricted by the first surface and the second surface of the grooves, the growth process of the channel layer and the second adjusting layer avoids the situation that they cannot be kept completely vertical or growth surfaces are not in the same plane, and a situation that a plurality of complex growth surfaces may appear, thus facilitating realizing the control over the device and the improvement on electrical performance.

An optional semiconductor device and a manufacturing method thereof are described with reference to FIGS. 24-28. FIGS. 24-28 are top views.

Optionally, a first sub-layer 2011 of the channel layer, a second adjusting layer 2014, a first adjusting layer 2013, and a second sub-layer 2012 of the channel layer are formed in the groove in a direction along the first surface and the second surface of the channel, and the first sub-layer of the channel layer, the second adjusting layer 2014, the first adjusting layer 2013, and the second sub-layer of the channel layer completely fill the groove and the various layers are enabled to be parallel to the first surface of the channel and coplanar. The second adjusting layer is configured to control the threshold voltage, and the first adjusting layer is configured to adjust the electric field distribution, in particular the electric field distribution at the edge of the gate electrode. It may be understood that the first adjusting layer and the second adjusting layer have P-type doping, or N-type doping, and exemplarily, the P-type doping is P-type GaN, and the N-type doping is N-type GaN. Exemplarily, the doping concentration of the second adjusting layer 2014 is $1E17$-$5E19/cm^3$, and more preferably $1E+18/cm^3$-$5E+19/cm^3$. The P-type GaN layer may deplete the two-dimensional electron gas on the first face of the channel layer; and the N-type GaN layer may deplete the two-dimensional hole gas on the second face of the channel layer, further causing the device to be in a normally off state. Whether to specifically select the P-type doping or the N-type doping depends on the specific type of the subsequent device. The P-type doping is selected for the HEMT device, and the N-type doping is selected for the HHMT device. It may be understood that the doping may be graded. Projection of the second adjusting layer on the first face of the channel layer falls within a range of the gate; and projection of the first adjusting layer on the first face of the channel layer falls in a range between the gate and the drain, or partially overlaps projection of the gate in this direction. The doping concentration, dimensional parameter, etc. of the second adjusting layer may be set according to the device parameters, as long as 95%-100% of the two-dimensional electron gas or the two-dimensional hole gas above can be depleted. When the concentration of the two-dimensional charge carrier gas is higher, the corresponding doping concentration may be improved accordingly. Exemplarily, the doping concentration of the first adjusting layer is less than $5E18/cm^3$.

In the above, the doped first adjusting layer and second adjusting layer are provided perpendicular or oblique to a side surface of the channel layer, and through the designed doping distribution, further response to an externally applied electric field and change the electric field distribution when the device is off, so that the local electric field intensity may be effectively reduced, particularly the electric field peak value of a terminal of the gate close to the drain may be reduced. The adjusting layers herein are preferably epitaxially grown laterally, which, compared with the ion implantation mode, will not cause problems such as ion implantation damage, and has good electrical properties.

When the device is in the off state, the bottom electrode may be in various electrical connections with the first adjusting layer, the second adjusting layer, and the two-dimensional carrier gas, for example, the bottom electrode may be connected to the first adjusting layer and/or the second adjusting layer, also may be connected to the first adjusting layer and the two-dimensional carrier gas, or may be simultaneously connected to the first adjusting layer, the second adjusting layer, and the two-dimensional carrier gas. The situation that the potential of the electric field adjustment doped layer is unstable may be avoided through various forms of independent or synergistic effect of the first adjusting layer, the second adjusting layer, and the two-dimensional carrier gas.

A method for manufacturing the semiconductor device is described in detail below.

Step 11': as shown in FIGS. 24-28, after the seed layer 106 is formed, a first sub-layer 2011 of the channel layer is selectively grown with the seed layer 106 as a core. Due to the presence of the grooves 102, the first sub-layer 2011 starts to be epitaxially grown laterally along the grooves 102 from the seed layer, wherein the growth includes growth in a first direction along the first surface or the second surface of the groove, and growth perpendicular to the third surface of the groove. Then, taking the first sub-layer 2011 as a core, the doped second adjusting layer 2014 is grown, and the growth of the second adjusting layer 2014 includes growth in the first direction along the first surface or the second surface of the groove, and also includes growth in a second direction perpendicular to the first surface or the second surface of the groove, and growth perpendicular to the third surface of the groove. The second adjusting layer 2014 is located within a projection range of the gate in a projection direction of the subsequent device. Then, taking the second adjusting layer 2014 as a core, the doped first adjusting layer 2013 is grown, and the growth of the first adjusting layer 2013 includes growth in the first direction along the first surface or the second surface of the groove, and also includes growth in a second direction perpendicular to the first surface or the second surface of the groove, and growth perpendicular to the third surface of the groove. The first adjusting layer 2013 is located within a range from the gate to the drain in a projection direction of the subsequent device, or partially overlaps the projection of the gate. Then, taking the first adjusting layer 2013 as a core, the second sub-layer 2012 of the channel layer is continuously grown, and the second sub-layer may be an intrinsic GaN layer or a non-intentionally doped GaN layer. The growth direction of the second sub-layer 2012 is the same as the growth direction of the first sub-layer or the two adjusting layers. Finally, a part of the first sub-layer, the two adjusting layers, and the second sub-layer grown perpendicular to the third surface of the groove and located outside the groove is removed by a planarization or etching technique, so that the first sub-layer, the two adjusting layers, and the second sub-layer are all located in the groove, thus forming a coplanar structure. The coplanar structure may make the device in a restricted state during formation, which is advantageous for forming a specific structure and size, and helpful to form a device with a relatively high aspect ratio, thus providing a means for realizing a high aspect ratio device in addition to the adjustment of the growth process parameters, and as the growth of the channel layer and the two adjusting layers in the grooves is restricted by the first surface and the second surface of the groove, the growth process of the channel layer and the two adjusting layers avoids the situation that they cannot be kept completely vertical or growth surfaces are not in the same plane, and a situation that a plurality of complex growth surfaces may appear, thus facilitating realizing the control over the device and the improvement on electrical performance.

Figure 29:
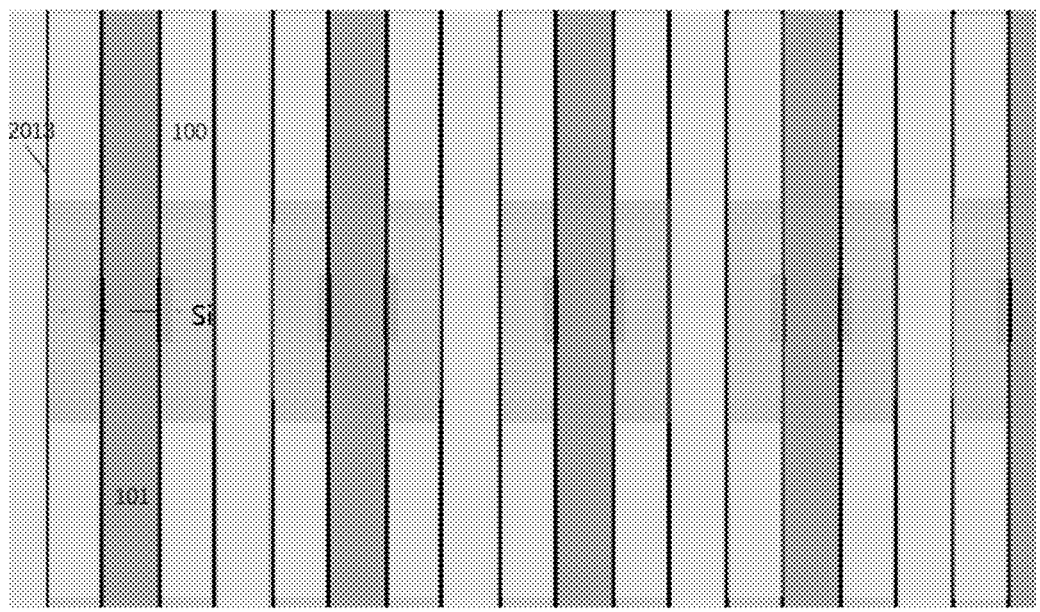
FIGS. 29-31 are schematic views of an optional semiconductor device structure and a manufacturing method thereof.
Figure 30:
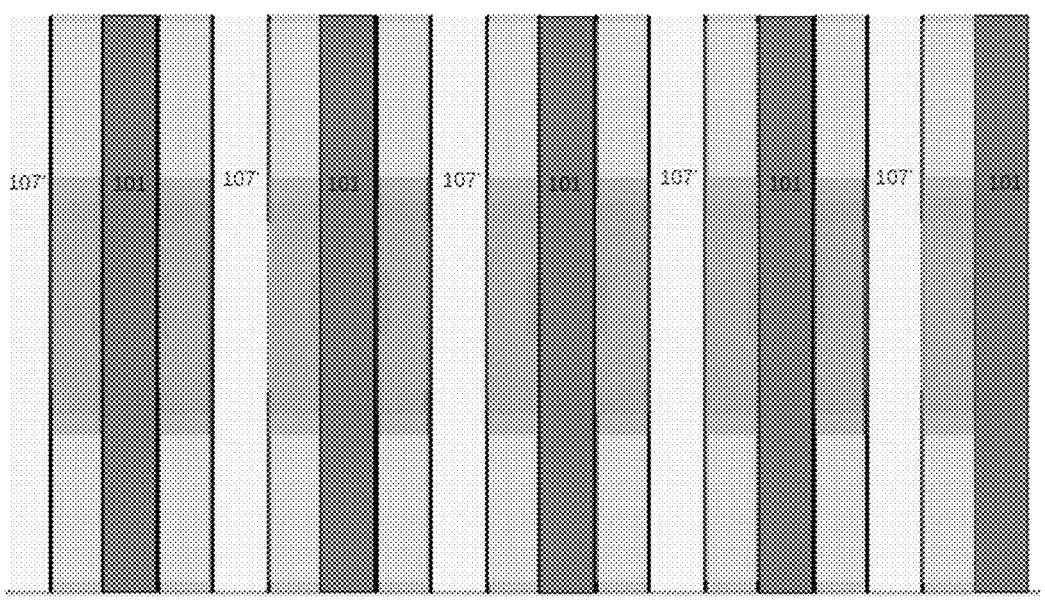
Figure 31:
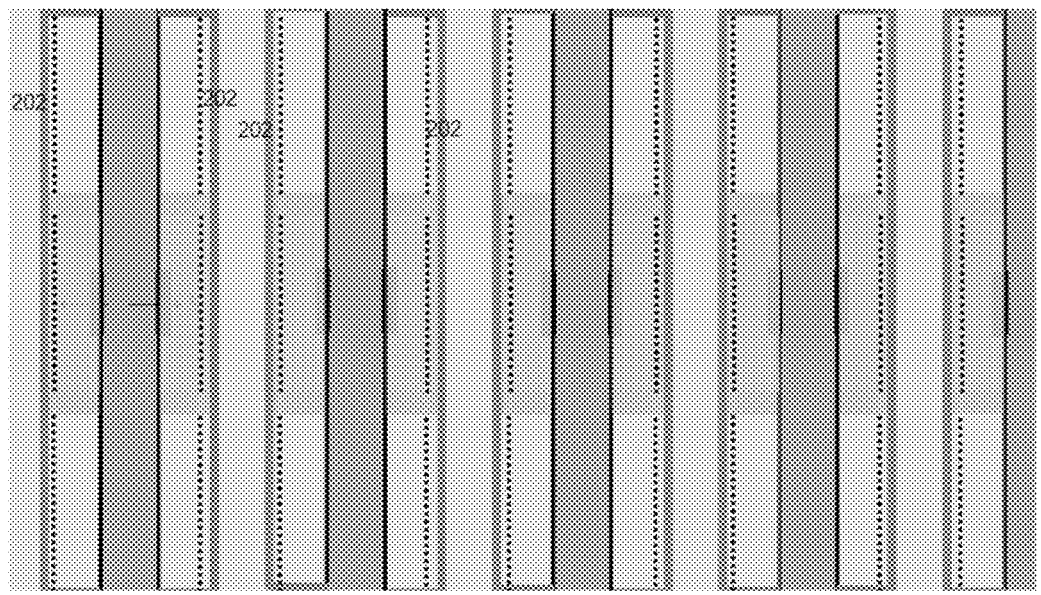

As shown in FIG. 29-31, optionally, one side of the channel layer is etched to remove the first dielectric layer 101 and a part of the substrate 100, so that the substrate has a first surface and a fifth surface lower than and in parallel with the first surface. When the HEMT device is formed, the first face 2013 of the channel layer 201 having the sponta- neous polarization effect and the piezoelectric polarization effect is exposed, and when the channel layer is GaN, the first face 2013 is a (0001) face. In this case, a second face 2014, opposite to the first face 2013, having a spontaneous polarization effect and a piezoelectric polarization effect is still covered by the substrate and the first dielectric layer, the second face 2014 is (000$\bar{1}$) face of GaN. When the HHMT device is formed, the second face 2014 of the channel layer 201, having a spontaneous polarization effect and a piezoelectric polarization effect, is exposed. When the channel layer is GaN, the second face 2014 is a (000$\bar{1}$) face. In this case, the first face 2013, opposite to the second face 2014, having the spontaneous polarization effect and the piezoelectric polarization effect, is still covered by the substrate and the first dielectric layer, and the first face 2013 is a (0001) face of GaN. A third dielectric layer 107 is formed on the etched substrate 100 to isolate the exposed silicon substrate, and exemplarily, the third dielectric layer may be a silicon dioxide layer. Then, a barrier layer 202 is formed on the first face 2013 or the second face 2014 of the channel layer 201, wherein the barrier layer is an AlN layer or an AlGaN layer, so that a two-dimensional electron gas 2DEG is formed on the first face 2013 of the channel layer or a two-dimensional hole gas 2DHG is formed on the second face 2014 of the channel layer.

Thus, the bottom electrode 404 is connected to the first adjusting layer 2013 or the bottom electrode is connected to the first adjusting layer 2013 and the second adjusting layer 2014, which further responses to an externally applied electric field and changes the electric field distribution when the device is off, therefore, the local electric field intensity may be effectively reduced, particularly the electric field peak value of a terminal of the gate close to the drain may be reduced.

A method for manufacturing the HEMT semiconductor device will now be illustratively described with reference to FIGS. 29-31 in combination with the preceding manufacturing method.

Step 12', as shown in FIG. 29, a photolithographic pattern is formed, a region on the first face 2013 side of the channel layer is exposed, the first dielectric layer 101 and a part of the substrate 100 in this region are etched to expose the fourth dielectric layer on the first face of the channel layer 201 having the spontaneous polarization effect and the piezoelectric polarization effect. The second face 2014, opposite to the first face 2013, having a spontaneous polarization effect and a piezoelectric polarization effect, is still surrounded (covered) by the fourth dielectric layer, the substrate, and the first dielectric layer.

Step 13', as shown in FIG. 30, a third dielectric layer 107' is formed on the etched substrate 100. Exemplarily, the third dielectric layer may be a silicon dioxide layer formed by oxidation. In the case of isolating the exposed silicon substrate by the third dielectric layer, the fourth dielectric layer covering the first face 2013 of the channel layer 201 is removed.

Step 14', as shown in FIG. 31, a second semiconductor layer 202 is formed on the first face 2013 of the channel layer 201 by chemical deposition, wherein the second semiconductor layer may be an AlN layer or an AlGaN layer, so that a two-dimensional electron gas 2DEG can be formed on the first face 2013 of the channel layer.

It may be understood that the manufacturing method of the HHMT semiconductor device is similar to the above manufacturing method, and will not be described herein again.

It may be understood that, in some embodiments, the manner of forming the photolithographic pattern may also be changed, wherein all regions between adjacent first groove and second groove are exposed from the top, and the first dielectric layer 101 and a part of the substrate 100 in the regions are etched, so that the channel layer covered by the fourth dielectric layer in the groove 102 protrudes from the fourth surface of the etched substrate, then, only the region on the first face/second face of the channel layer is further etched. For a specific method, reference may be made to the foregoing embodiments, and details are not described herein again.

Figure 32:
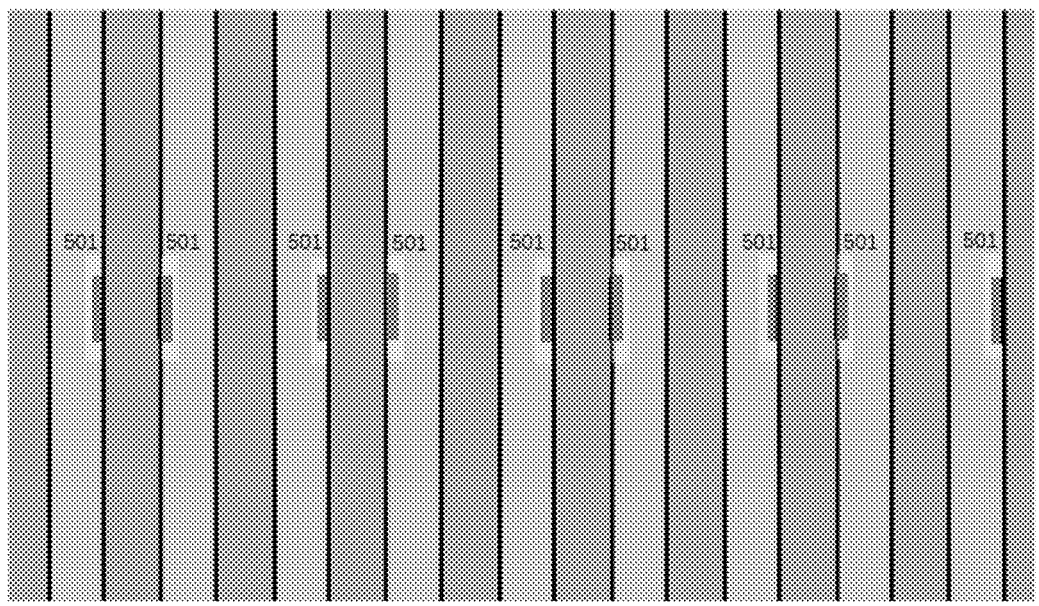
FIG. 32 is a schematic view of an optional semiconductor device structure and a manufacturing method thereof.

Optionally, a position where the single crystal seed layer is located corresponds to a formation position of a third electrode (drain) of the subsequent device, in this case, in order to avoid problems such as poor crystal quality and large leakage current in the nucleation region, as shown in FIG. 32, a current blocking layer may be provided on the single crystal seed layer, the current blocking layer, for example, may be of heavily doped C or Fe elements, and a doping concentration of C or Fe may be $1E17$-$1E20/cm^3$.

Optionally, the position of the single crystal seed layer may also be provided in a region between a source electrode and a drain electrode. Exemplarily, the above technical problems may be overcome by separating a position where the seed layer is located from a position where a subsequent drain electrode region is located by a certain distance.

Optionally, for the region where the single crystal seed layer is provided, the corresponding region of the first and second grooves may be exposed through photolithography.

The current blocking layer may be formed by corresponding doping during epitaxial growth with the single crystal seed layer as a core.

Figure 33:
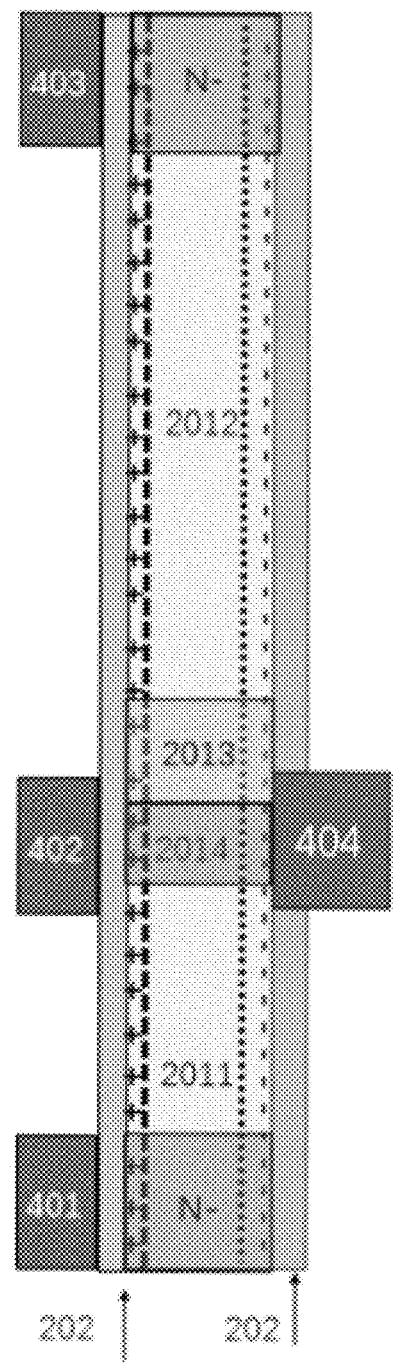
FIG. 33 is a schematic view of an optional semiconductor device structure and a manufacturing method thereof.
Figure 34:
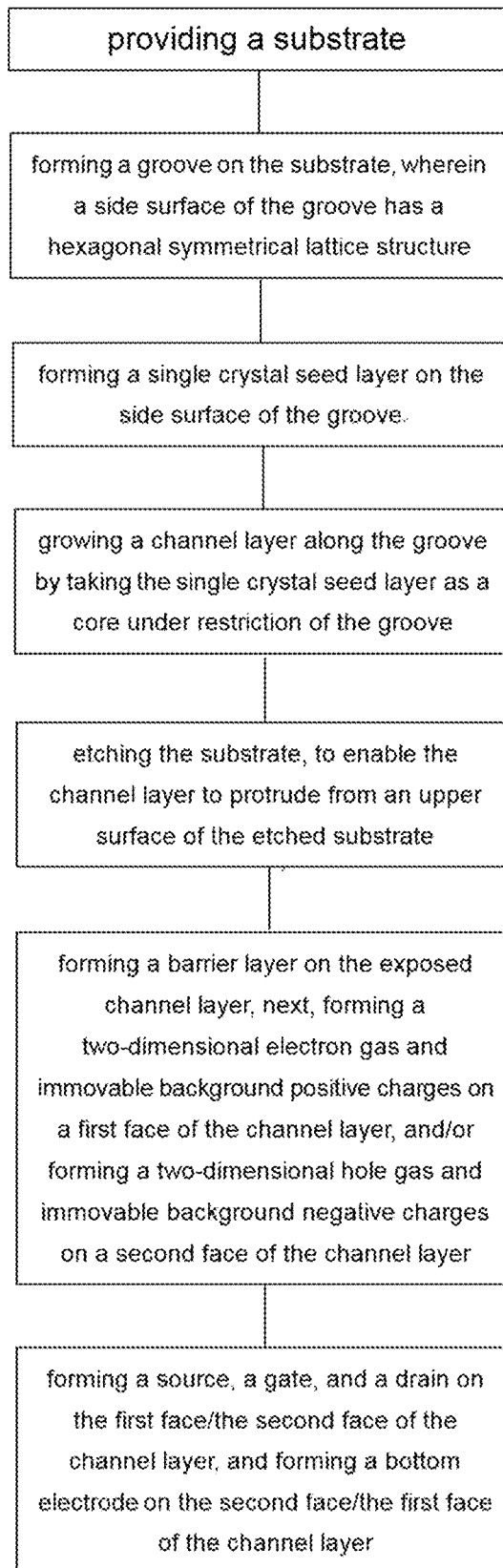
FIG. 34 is a schematic view of an optional method for manufacturing semiconductor device structure.

Optionally, as shown in FIG. 33, doping is performed in the source region and the drain region to reduce contact resistance. It may be understood that, when the HEMT device is formed, the doping type of the source region and the drain region is N-type; and when the HHMT device is formed, the doping type of the source region and the drain region is P-type.

Optionally, in the HEMT device, the barrier layer may be removed so that the source and/or the drain is in physical contact with the channel layer, and forms ohmic contact with the two-dimensional electron carrier gas (2DEG), and due to the existence of the doped source region and drain region, such manner of being directly in physical contact with the channel layer is more beneficial for reducing the ohmic contact resistance through the design of the process and structure.

Optionally, in the HHMT device, as the P-type ohmic contact is more difficult to form, when the barrier layer is removed to make the source (and/or the drain) in physical contact with the channel layer, and form ohmic contact with the two-dimensional hole carrier gas (2DHG), due to the existence of the doped source region and drain region, such manner of being directly in physical contact with the channel layer is more beneficial for reducing the ohmic contact resistance through the design of the process and structure.

A method for manufacturing the semiconductor device is illustratively described in combination with the preceding manufacturing method.

Figure 25:
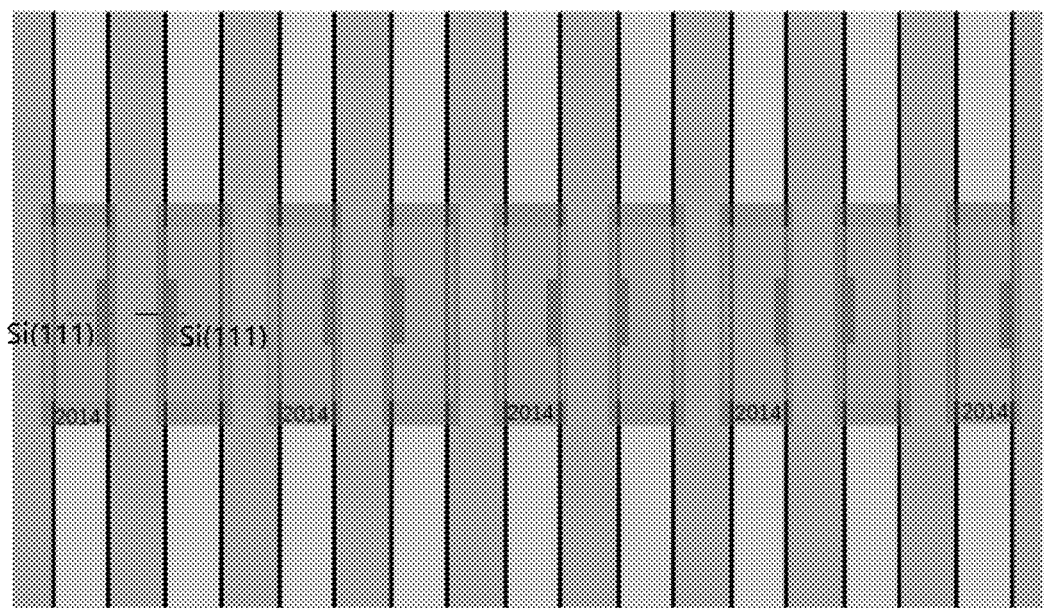
Figure 26:
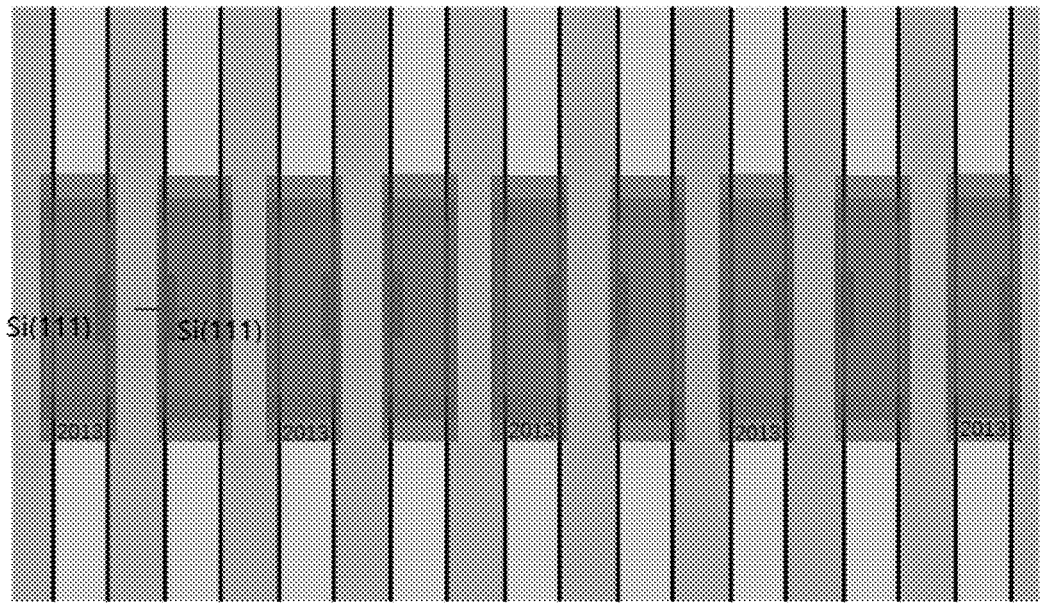
Figure 27:
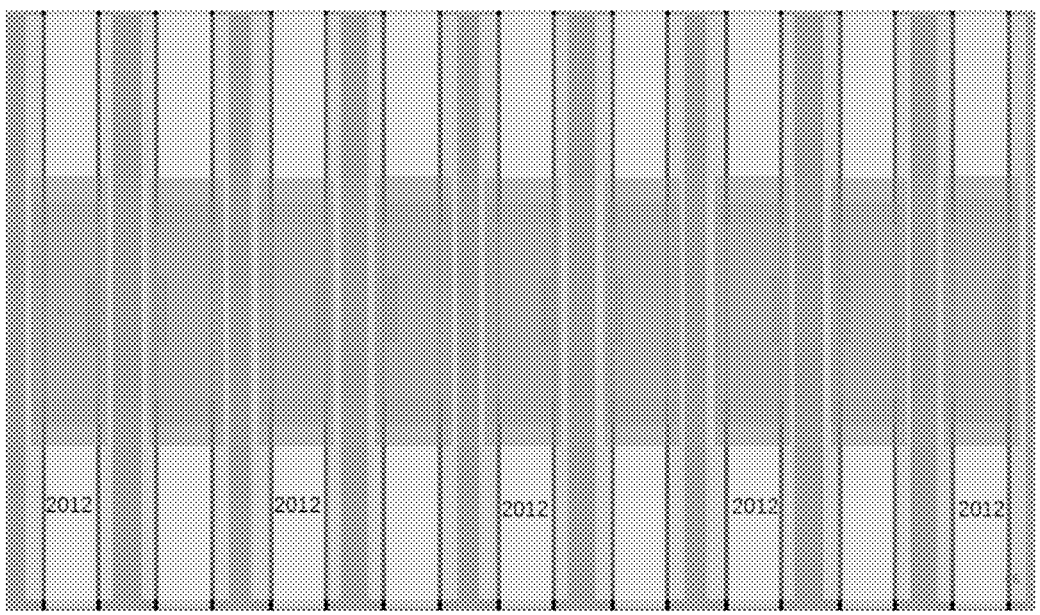
Figure 28:
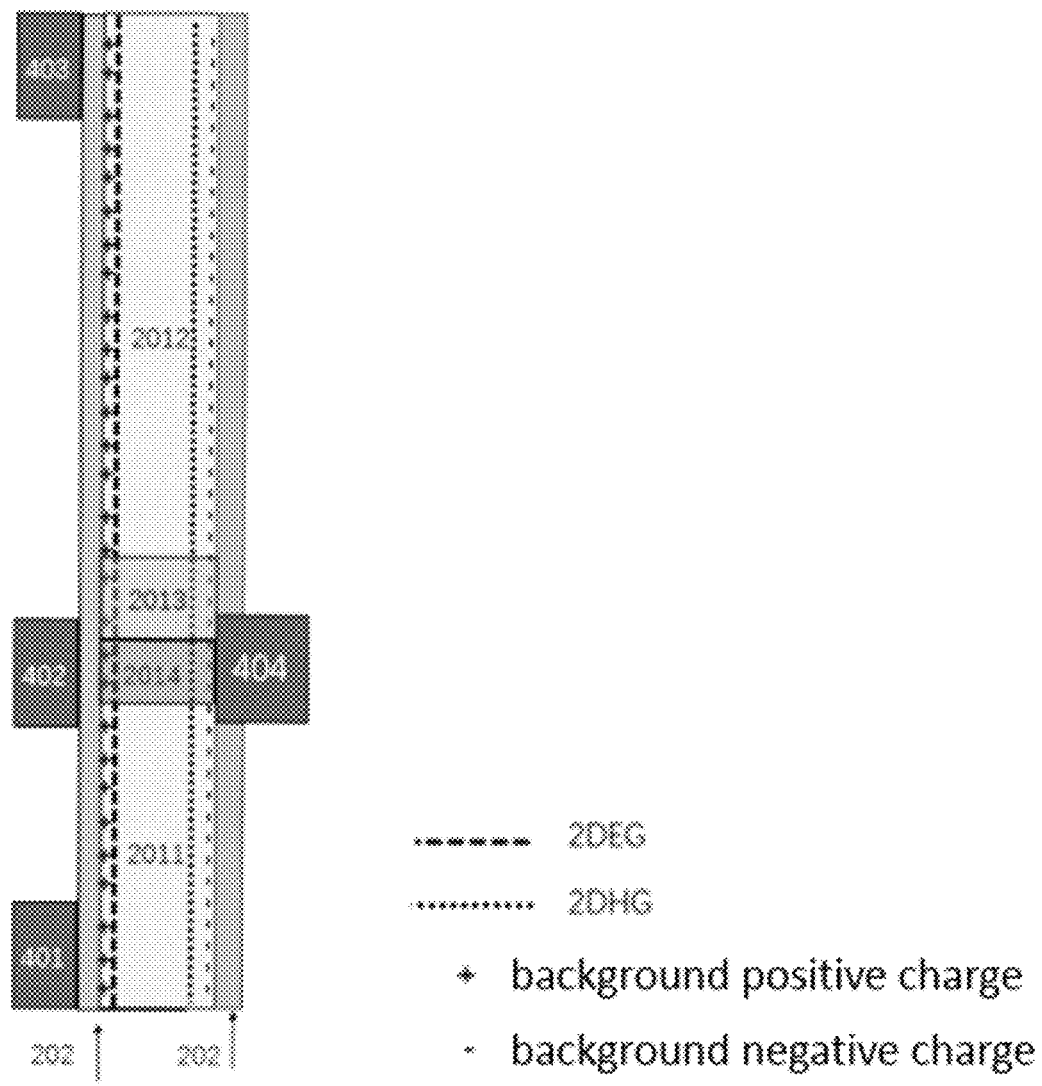

Taking a case where the seed layer corresponds to the source region as an example, the doping of the source region and the drain region will be described. The case where the seed layer corresponds to the drain region, or the case where the seed layer is located between the gate region and the drain region is similar to the case where the seed layer corresponds to the source region, which will not be described herein again. As shown in FIG. 25, after the seed layer is formed, in a process of growing the channel layer 201 by taking the seed layer as a core, corresponding P-type or N-type doping is performed in the source region.

Optionally, in the process of growing the channel layer 201 with the seed layer as a core, before performing the corresponding doping, an intrinsic (non-doped) channel layer or a non-intentionally doped channel layer is grown first, and then the doped source region is grown.

Next, after the doped source region is formed, epitaxial growth of the intrinsic channel layer or the non-intentionally doped channel layer is continued to form the channel region. It may be understood that corresponding doping may be selected to perform in the channel region to form the first adjusting layer and/or the second adjusting layer.

Then, in the process of subsequent epitaxial growth of the channel layer, corresponding P-type or N-type doping may be performed in the drain region.

It may be understood that, the doping of the drain region and the source region and the doping of the adjusting layer may be performed simultaneously, and the doping of the drain region, the doping of the source region, and the doping of the adjusting layer may be performed successively.

It may be further understood that the device may be formed as a complementary semiconductor device with HHMT and HEMT existing simultaneously.

A supply unit, including any one of the above semiconductor devices. The supply unit includes a primary circuit, a secondary circuit, a transformer and so on, wherein the primary circuit and the secondary circuit each include a switching element, and wherein the switching element is any one of the semiconductor devices described above.

A cellphone, including any one of the semiconductor devices described above. The cellphone includes a display screen, a charging unit and so on, wherein the charging unit includes any one of the semiconductor devices described above.

An amplifier, wherein the amplifier may be a power amplifier applied to the field such as mobile phone base station and optical communication system, and the power amplifier may include any one of the semiconductor devices described above.

The solution of the present disclosure at least can be helpful to realize one of the following effects: the semiconductor device can reduce the gate leakage current, has a high threshold voltage, high power, and high reliability, can achieve a low on-resistance and a normally off state of the device, and can provide a stable threshold voltage, such that the semiconductor device has good switching characteristics.

The solution of the present disclosure further can be helpful to realize one of the following effects: the local electric field intensity may be effectively reduced, and the overall performance and reliability of the device may be improved; and the structure and manufacturing process of the semiconductor device are relatively simple, which can effectively reduce the manufacturing cost.

The present disclosure is described in the above in conjunction with the specific embodiments, but a person skilled in the art should understand that all of these descriptions are illustrative, rather than limitation on the scope of protection of the present disclosure. A person skilled in the art could make various variations and modifications to the present disclosure in accordance with the spirit and principle of the present disclosure, and these variations and modifications are also within the scope of the present disclosure.

INDUSTRIAL APPLICABILITY

The semiconductor device and the manufacturing method thereof provided in the present disclosure are simple in process, low in cost, and energy-saving, have a relatively high aspect ratio, can realize a higher channel density in unit area, and have high performances such as high withstand voltage, high power, and low on-resistance.

What is claimed is:

1. A method for adjusting electric field distribution of a semiconductor device, comprising:
   step 100: providing a substrate;
   step 200: forming a groove on the substrate, wherein a side surface of the groove is in a hexagonal symmetrical lattice structure;
   step 300: forming a single crystal seed layer on the side surface of the groove;
   step 403: growing, by taking the single crystal seed layer as a core, a first channel layer, a first adjusting layer, a second adjusting layer and a second channel layer along the groove, which is restricted by the groove, wherein the first adjusting layer is configured to adjust electric field distribution, and the second adjusting layer is configured to control a threshold voltage, or
   step 402: growing, by taking the single crystal seed layer as the core, the first channel layer, a second adjusting layer and the second channel layer along the groove, which is restricted by the groove, wherein the second adjusting layer is configured to control a threshold voltage;
   step 500: etching the substrate, to enable the first channel layer, the first adjusting layer, the second adjusting layer and the second channel layer to protrude from an upper surface of an etched substrate, or etching the substrate, to enable the first channel layer, the second adjusting layer and the second channel layer to protrude from an upper surface of an etched substrate;
   step 600: forming a barrier layer on the first channel layer, the first adjusting layer, the second adjusting layer and the second channel layer which are exposed, or on the first channel layer, the second adjusting layer and the second channel layer which are exposed, then forming a two-dimensional electron gas and immovable background positive charges on a first face of the channel layer, and/or forming a two-dimensional hole gas and immovable background negative charges on a second face of the channel layer; and
   step 700: forming a source, a gate, and a drain on one of the first face of the first channel layer/and the second face of the second channel layer, and forming a bottom electrode on the other of the second face of the second channel layer/and the first face of the first channel layer; wherein an area where the second adjusting layer is projected on the first face of the first channel layer is in a range of the gate, and an area where the first adjusting layer is projected on the first face of the first channel layer is in a range between the gate and the drain or partially overlaps with an area of the gate in a direction where the first adjusting layer is projected on the first face of the first channel layer, wherein the area where the first adjusting layer is projected on the first face of the first channel layer and the area where the second adjusting layer is projected on the first face of the first channel layer are side by side within the first channel layer and the second channel layer.

2. The method according to claim 1, wherein in the case of growing by taking the single crystal seed layer as a core a first channel layer, a second adjusting layer and a second channel layer along the groove, which is restricted by the groove, the bottom electrode is connected to the second adjusting layer, and the two-dimensional electron gas/the two-dimensional hole gas; and
   in the case of growing by taking the single crystal seed layer as a core a first channel layer, a first adjusting layer, a second adjusting layer and a second channel layer along the groove, which is restricted by the groove, the bottom electrode is connected to the first adjusting layer, the second adjusting layer, and the two-dimensional electron gas/the two-dimensional hole gas.

3. The method according to claim 2, wherein the bottom electrode is formed on the second face of the channel layer, and the first adjusting layer/the second adjusting layer has P-type doping; or the bottom electrode is formed on the first face of the channel layer, and the first adjusting layer/the second adjusting layer has N-type doping.

4. The method according to claim 3, wherein a doping concentration in the first adjusting layer is less than $5E18/cm^3$; and a doping concentration in the second adjusting layer is $1E17$-$5E19/cm^3$.

5. The method according to claim 2, wherein the source, the gate, and the drain are provided to be coplanar or non-coplanar.

6. The method according to claim 2, wherein the source and the drain are directly or indirectly formed on the channel layer, and the gate is directly or indirectly formed on the barrier layer.

7. The method according to claim 1, wherein before growing the channel layer, a buffer layer is deposited on the seed layer.

8. The method according to claim 1, wherein the seed layer is provided in a position corresponding to the source, a position corresponding to the drain or a position between the gate and the drain.

9. The method according to claim 1, wherein when the seed layer is provided in a position corresponding to the drain, a current blocking layer is further formed on the seed layer.

10. The method according to claim 1, wherein when an HEMT device is formed, N-type doping is performed for a source region and a drain region; and when an HHMT device is formed, P-type doping is performed for the source region and the drain region.

11. The method according to claim 1, wherein a dielectric layer is formed on a side surface and a bottom surface of the groove.

12. A semiconductor device, comprising:
   a substrate, wherein the substrate has a side surface in a hexagonal symmetrical lattice structure;
   a single crystal seed layer;
   a first channel layer, a first adjusting layer, a second adjusting layer and a second channel layer which are grown with the seed layer as a core, or a first channel layer, a second adjusting layer and a second channel layer which are grown with the seed layer as a core, wherein the first channel layer, the first adjusting layer, the second adjusting layer and the second channel layer, or the first channel layer, the second adjusting layer and the second channel layer protrude from an upper surface of the substrate, wherein the first adjusting layer is configured to adjust electric field distribution, and the second adjusting layer is configured to control a threshold voltage;

a barrier layer formed on the first channel layer, the first adjusting layer, the second adjusting layer and the second channel layer which protrude, or the first channel layer, the second adjusting layer and the second channel layer;

a two-dimensional electron gas and immovable background positive charges formed on a first face of the first channel layer, and/or a two-dimensional hole gas and immovable background negative charges formed on a second face of the second channel layer; and a source, a gate, and a drain formed on one of the first face of the first channel layer and the second face of the second channel layer, and a bottom electrode formed on the other of the second face of the second channel layer and the first face of the first channel layer, wherein when the bottom electrode is formed on the second face of the second channel layer, an HEMT device is formed; and when the bottom electrode is formed on the first face of the first channel layer, an HHMT device is formed, and an area where the second adjusting layer is projected on the first face of the first channel layer is in a range of the gate, and an area where the first adjusting layer is projected on the first face of the first channel layer is in a range between the gate and the drain or partially overlaps with an area of the gate in a direction where the first adjusting layer is projected on the first face of the first channel layer, wherein the area where the first adjusting layer is projected on the first face of the first channel layer and the area where the second adjusting layer is projected on the first face of the first channel layer are side by side within the first channel layer and the second channel layer.

13. The semiconductor device according to claim 12, wherein in the case that the semiconductor device comprises a first channel layer, a second adjusting layer and a second channel layer, the bottom electrode is connected to the second adjusting layer, and the two-dimensional electron gas/the two-dimensional hole gas; and in the case that the semiconductor device comprises a first channel layer, a first adjusting layer, a second adjusting layer and a second channel layer, the bottom electrode is connected to the first adjusting layer, the second adjusting layer, and the two-dimensional electron gas/the two-dimensional hole gas, so as to adjust electric field distribution of the device.

14. A complementary semiconductor device, comprising the semiconductor device according to claim 12.

* * * * *